US012591325B2

(12) United States Patent
Kim et al.

(10) Patent No.: US 12,591,325 B2
(45) Date of Patent: Mar. 31, 2026

(54) DISPLAY DEVICE INCLUDING A FINGER PRINT SENSOR

(71) Applicant: SAMSUNG DISPLAY CO., LTD., Yongin-si (KR)

(72) Inventors: Hye Sung Kim, Yongin-si (KR); Sung Wook We, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 46 days.

(21) Appl. No.: 18/480,347

(22) Filed: Oct. 3, 2023

(65) Prior Publication Data

US 2024/0032382 A1      Jan. 25, 2024

Related U.S. Application Data

(63) Continuation of application No. 16/663,130, filed on Oct. 24, 2019, now Pat. No. 11,793,054.

(30) Foreign Application Priority Data

Dec. 17, 2018     (KR) ........................ 10-2018-0163500

(51) Int. Cl.
*G06F 3/041* (2006.01)
*G06V 40/13* (2022.01)
(Continued)

(52) U.S. Cl.
CPC ........ *G06F 3/0412* (2013.01); *G06V 40/1306* (2022.01); *H04M 1/0266* (2013.01);
(Continued)

(58) Field of Classification Search
None
See application file for complete search history.

(56) References Cited

U.S. PATENT DOCUMENTS 10,123,424 B1    11/2018  Lee et al.
10,124,687 B2    11/2018  Percebon et al.
(Continued)

FOREIGN PATENT DOCUMENTS

CN        204926035        12/2015
CN        105718099 A       6/2016
(Continued)

OTHER PUBLICATIONS

European Search Report Dated Apr. 20, 2020 For European Application Serial No. 19215818.6.
(Continued)

*Primary Examiner* — Erik T. K. Peterson
(74) *Attorney, Agent, or Firm* — F. CHAU & ASSOCIATES, LLC

(57)          ABSTRACT

A display device includes a protective layer. A display panel is disposed on an upper surface of the protective layer. The display panel includes a display area configured to display an image and a non-display area at least partially surrounding the display area. A cover panel is disposed on a back surface of the protective layer. The cover panel includes an opening that exposes the protective layer. A fingerprint sensor is disposed within the opening of the cover panel. The fingerprint sensor is configured to sense a fingerprint. A first fixing member is disposed on one surface of the fingerprint sensor. A second fixing member at least partially overlaps at least one side of the first fixing member, the second fixing member fixing the fingerprint sensor. The first fixing member and the second fixing member each include at least one different material from each other.

11 Claims, 23 Drawing Sheets

(51) Int. Cl.
    *H04M 1/02*          (2006.01)
    *H10K 59/80*        (2023.01)
    *H10K 77/10*        (2023.01)
    *H10K 102/00*       (2023.01)

(52) U.S. Cl.
    CPC ........ *H10K 77/111* (2023.02); *H10K 59/8794*
                    (2023.02); *H10K 2102/311* (2023.02)

(56)                  References Cited

U.S. PATENT DOCUMENTS

| | | |
|---|---|---|
| 10,306,773 B2 | 5/2019 | Kim et al. |
| 2015/0363629 A1 | 12/2015 | Lee et al. |
| 2016/0077622 A1 | 3/2016 | Lee et al. |
| 2017/0300736 A1 | 10/2017 | Song et al. |
| 2018/0151641 A1 | 5/2018 | Choo et al. |
| 2018/0225500 A1 | 8/2018 | Han |
| 2018/0293420 A1 | 10/2018 | Kim et al. |
| 2018/0373913 A1 | 12/2018 | Panchawagh et al. |
| 2019/0073505 A1 | 3/2019 | Kwon et al. |
| 2019/0147214 A1 | 5/2019 | Lee et al. |
| 2019/0197286 A1 | 6/2019 | Kim et al. |

| | | |
|---|---|---|
| 2019/0205596 A1 | 7/2019 | Kim et al. |
| 2019/0205603 A1 | 7/2019 | Lee et al. |
| 2020/0045826 A1 | 2/2020 | Wang et al. |
| 2020/0065542 A1 | 2/2020 | Jin et al. |
| 2020/0133407 A1 | 4/2020 | Kim et al. |
| 2020/0194516 A1 | 6/2020 | Kim et al. |

FOREIGN PATENT DOCUMENTS

| | | |
|---|---|---|
| EP | 3328039 | 5/2018 |
| EP | 3605273 | 2/2020 |
| KR | 1841583 B1 | 3/2018 |
| KR | 10-2018-0046925 | 5/2018 |
| KR | 10-2018-059720 | 6/2018 |
| KR | 10-2018-0114796 A | 10/2018 |

OTHER PUBLICATIONS

Woo Chang Hwa: "Research Trend of OCA (Optically Clear additive) for Display Panel by Analysis of Patent and Papers Publication", Journal of the Semiconductor & Display Technology, Sep. 30, 2018, pp. 75-84, XP055890170, Retrieved from the Internet: URL: http://www.koreascience.or.kr/article/JAKO201809242560676.pdf (an English Abstract is included).

DD_NDA

FPS

DR1

DR2

FA $\begin{cases} \text{FA1} \\ \text{FA2} \end{cases}$

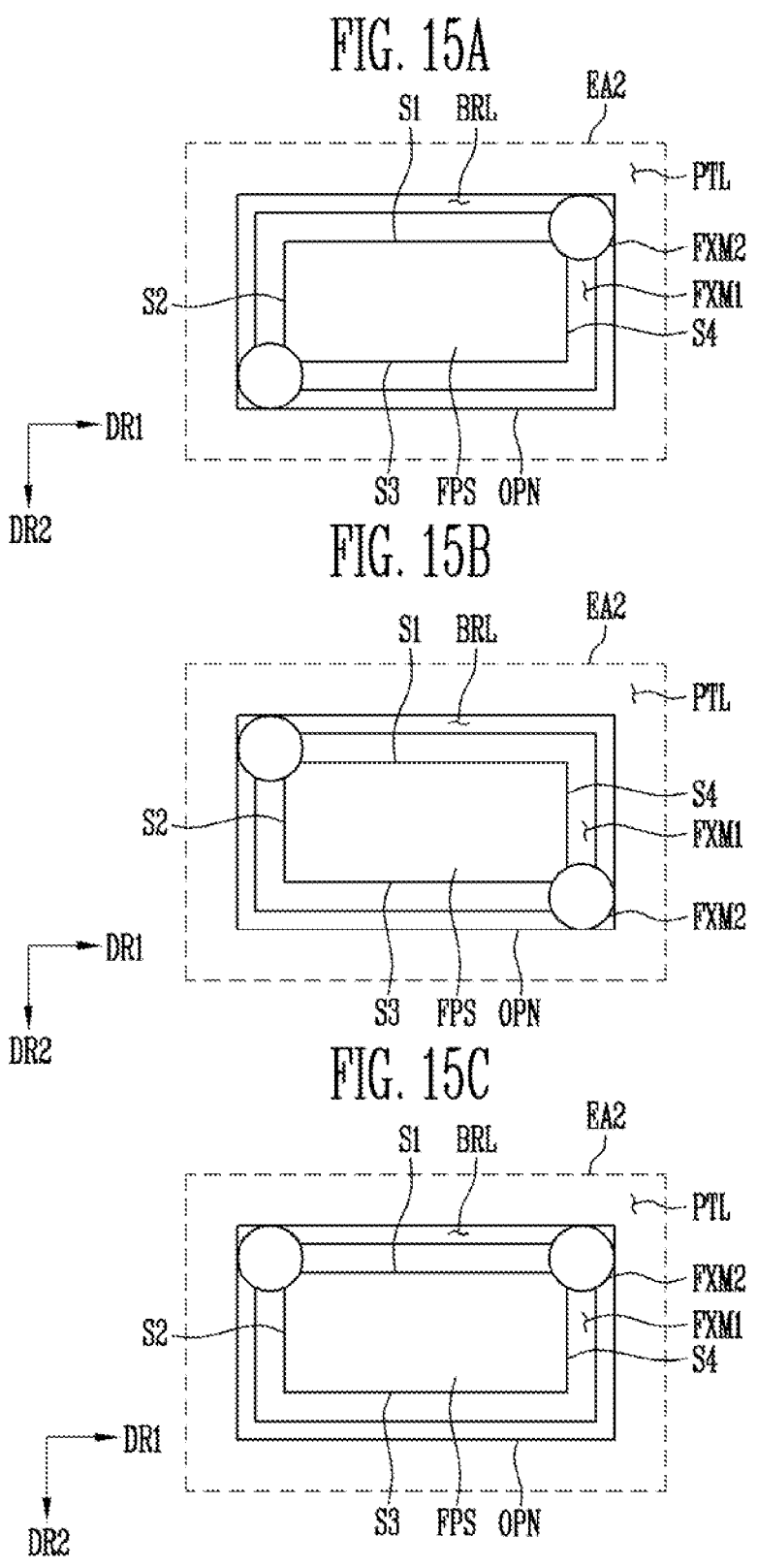

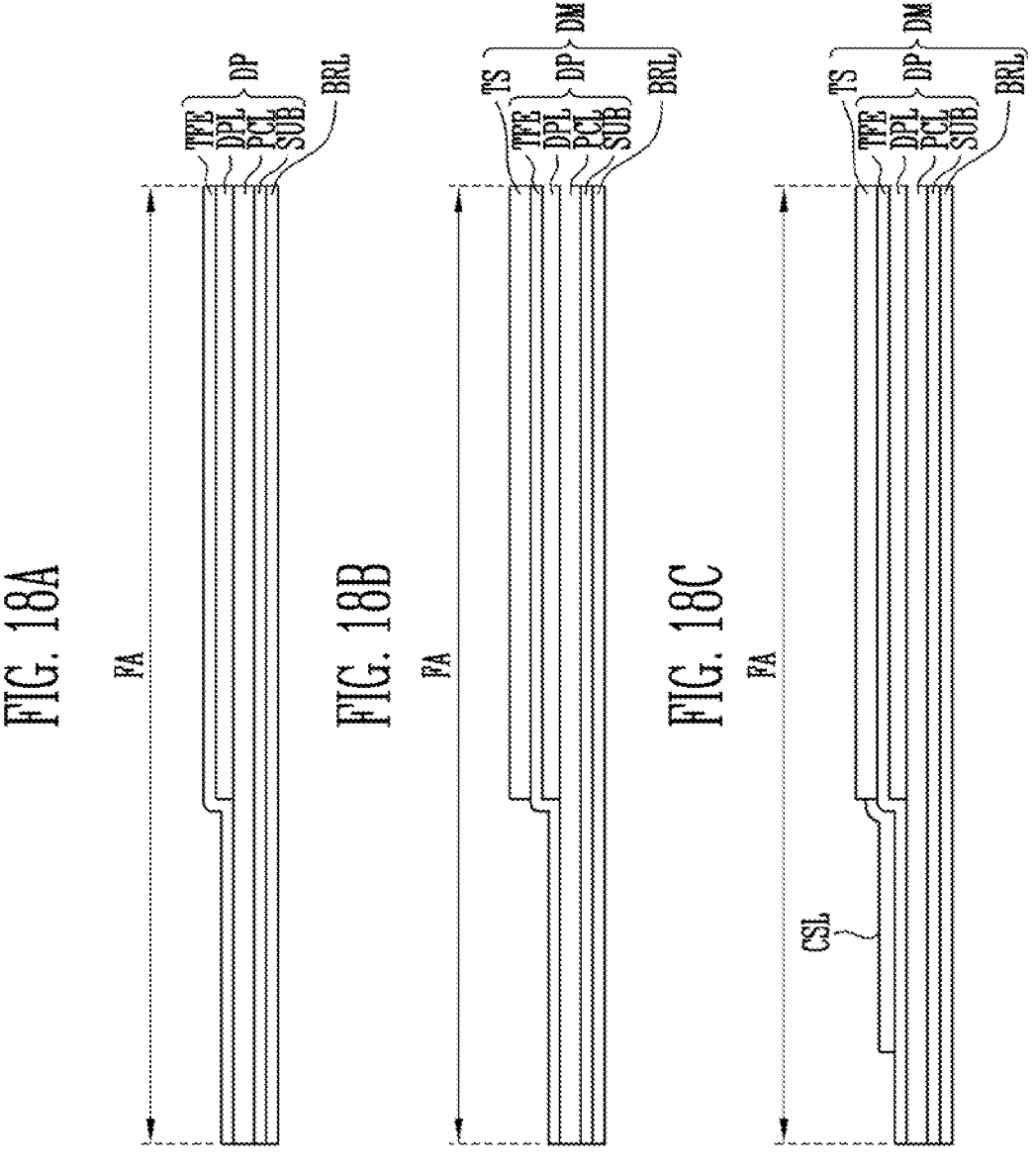

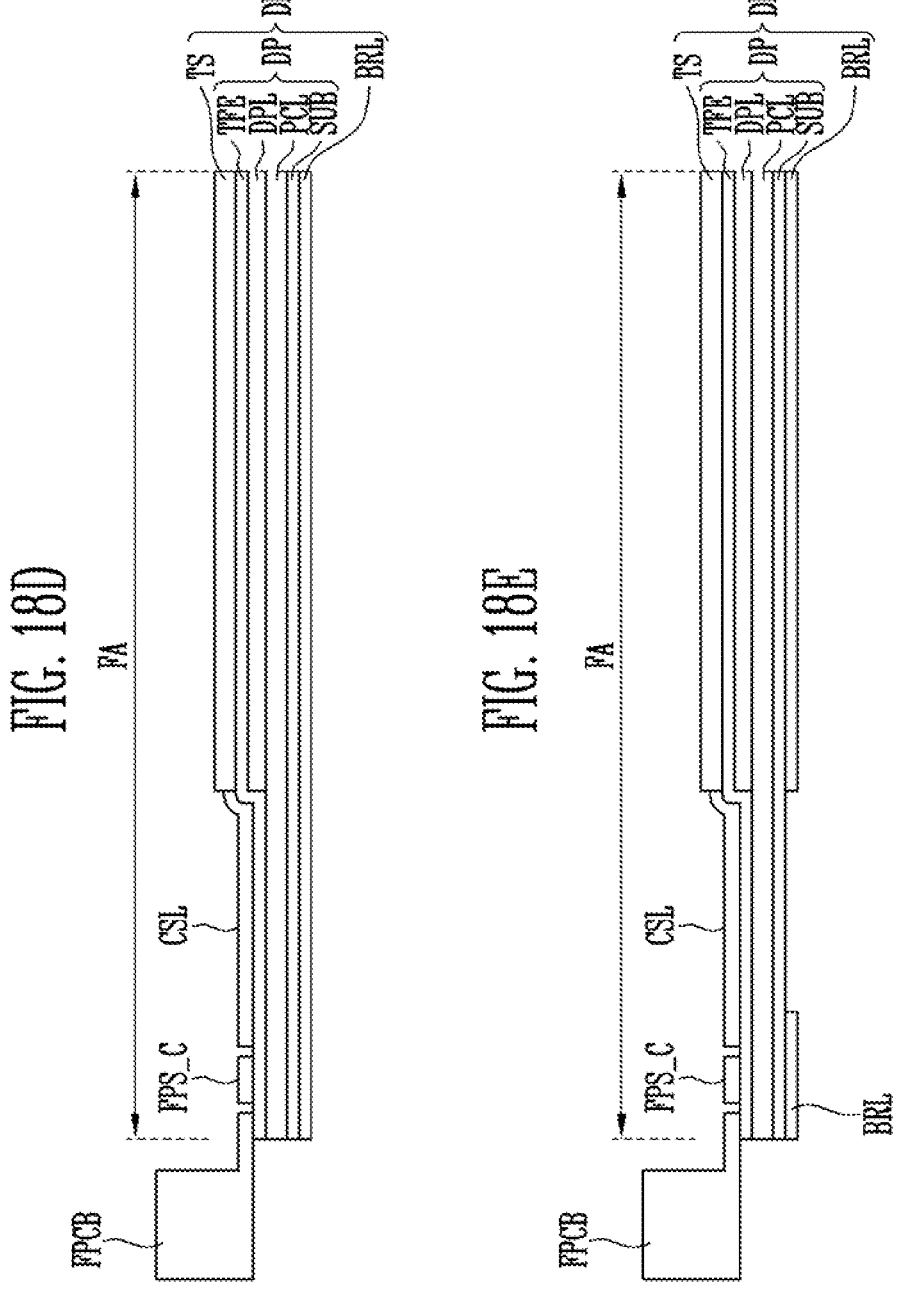

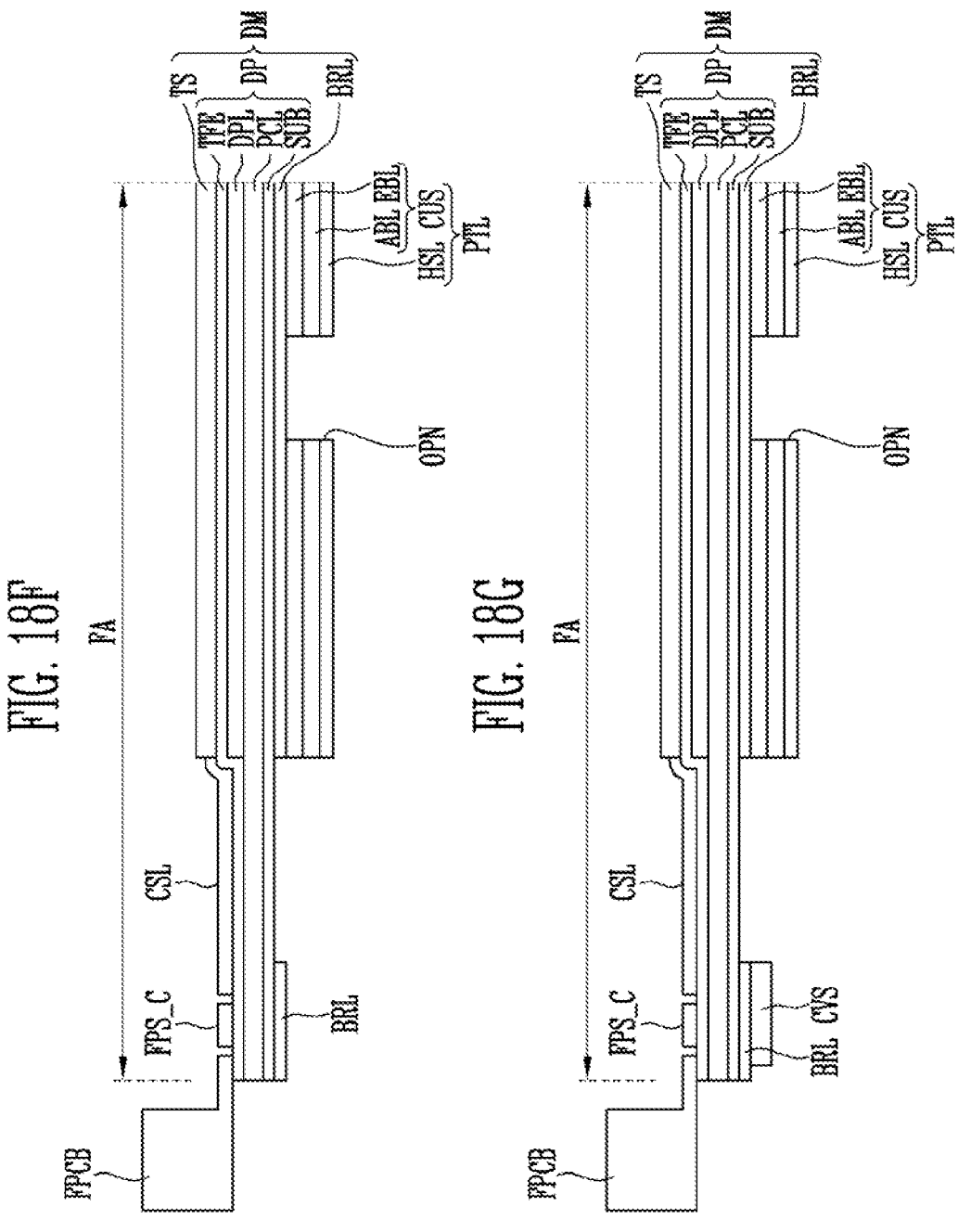

FXM { FXM1 FXM2 }   FA { FA1 FA2 }

DISPLAY DEVICE INCLUDING A FINGER PRINT SENSOR

CROSS-REFERENCE TO RELATED APPLICATION

The present application is a Continuation of co-pending patent application Ser. No. 16/663,130, filed on Oct. 24, 2019, which claims priority under 35 U.S.C. § 119(a) to Korean patent application 10-2018-0163500 filed on Dec. 17, 2018 in the Korean Intellectual Property Office, the entire disclosures of which are herein incorporated by reference.

TECHNICAL FIELD

The present disclosure relates to a display device and, more specifically, to a display device including a finger print sensor.

DISCUSSION OF THE RELATED ART

Recently, display devices, such as those of smart phones and tablet PCs, include biometric authentication sensors such as finger print sensors. Accordingly, various types of sensors have been embedded in display devices.

During the fabrication of these display devices, it is possible for the finger print sensor to be dislodged from its optimal position and this movement may reduce the accuracy of the fingerprint sensor after the fingerprint sensor is fixed.

SUMMARY

A display device includes a protective layer having an upper surface and a back surface opposite thereto. A display panel is disposed on the upper surface of the protective layer. The display panel includes a display area configured to display an image and a non-display area at least partially surrounding the display area. A cover panel is disposed on the back surface of the protective layer. The cover panel includes an opening that exposes at least one area of the protective layer. A fingerprint sensor is disposed within the opening of the cover panel. The fingerprint sensor is configured to sense a fingerprint. A first fixing member is disposed on one surface of the fingerprint sensor. A second fixing member at least partially overlaps at least one side of the first fixing member, the second fixing member fixing the fingerprint sensor. The first fixing member and the second fixing member each include at least one different material from each other.

A display device includes a cover panel having an opening therein. A protective layer is disposed on the cover panel. The protective layer has at least one area exposed through the opening. A display panel is disposed on the protective layer. The display panel is configured to display an image. The display panel includes a flat area and a bent area in continuation with the flat area. A crack prevention layer covers at least a portion of the display panel in the bent area of the display panel. A touch sensor is disposed on one surface of the display panel. A window is disposed on the touch sensor. A flexible printed circuit board is attached to at least one side of a back surface of the display panel. The flexible printed circuit board is connected to the cover panel. A fingerprint sensor is disposed in the opening of the cover panel. The fingerprint sensor is configured to sense a fingerprint. A first fixing member is disposed between the at least one area of the protective layer and the fingerprint sensor in the opening of the cover panel. The first fixing member fixes the fingerprint sensor to the protective layer. A second fixing member is disposed in the opening of the cover panel and at least partially overlaps with each of at least one side of the fingerprint sensor and at least one side of the first fixing member. The second fixing member fixes the fingerprint sensor to the protective layer. The first fixing member and the second fixing member include at least one different material.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 1 is a schematic plan view illustrating a display device having a fingerprint sensor mounted therein in accordance with exemplary embodiments of the present disclosure;

FIG. 5 is a plan view schematically illustrating a display panel shown in FIG. 4;

FIG. 12 is a perspective view illustrating in detail a portion of the display device shown in FIG. 2;

FIGS. 15A to 15F illustrate a second fixing member shown in FIG. 14, which are plan views corresponding to the portion EA2 shown in FIG. 13;

FIGS. 18A to 18L are cross-sectional views sequentially illustrating the method of combining the display panel, the touch sensor, the window, and the fingerprint sensor, which are shown in FIGS. 12 and 13, according to the flowchart shown in FIG. 17;

DETAILED DESCRIPTION

Figure 2:
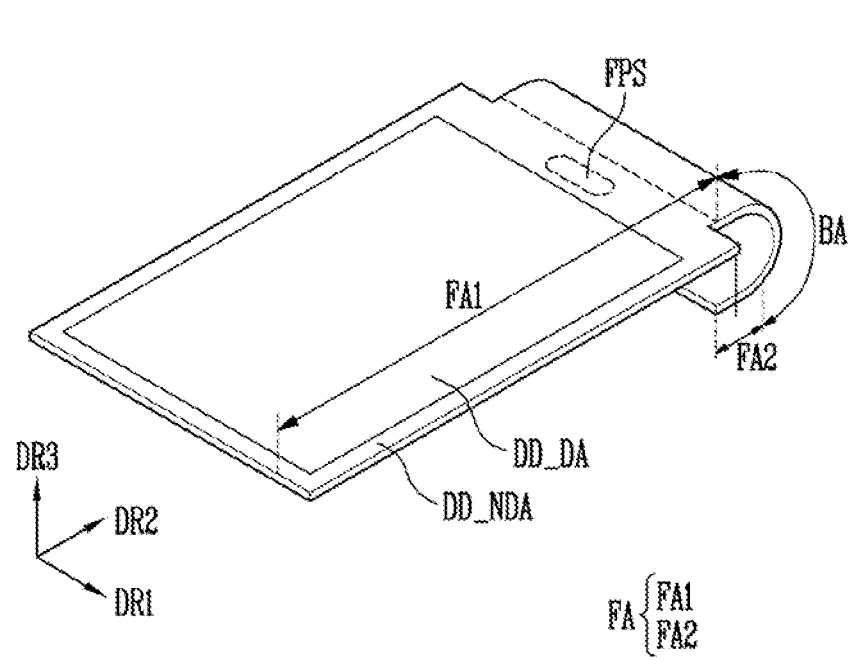
FIG. 2 is a schematic perspective view illustrating a display panel according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

The present disclosure may utilize various different shapes and dispositions, however, the recited shapes and dispositions are provided as illustrations of particular examples. However, it is to be understood that the examples set forth herein may be modified in various different ways, for example, by changing the shapes and dispositions of the elements introduced herein and that these changes should be understood as being part of the instant invention.

Like numbers refer to like elements throughout the specification and the drawings. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that an expression that an element such as a layer, region, substrate or plate is placed "on" or "above" another element indicates not only a case where the element is placed "directly on" or "just above" the other element but also a case where a further element is interposed between the element and the other element.

Hereinafter, exemplary embodiments of the present disclosure will be described in more detail with reference to the accompanying drawings. In the following description, an expression of a singular number includes an expression of the plural number, so long as it is clearly read differently.

Figure 1:
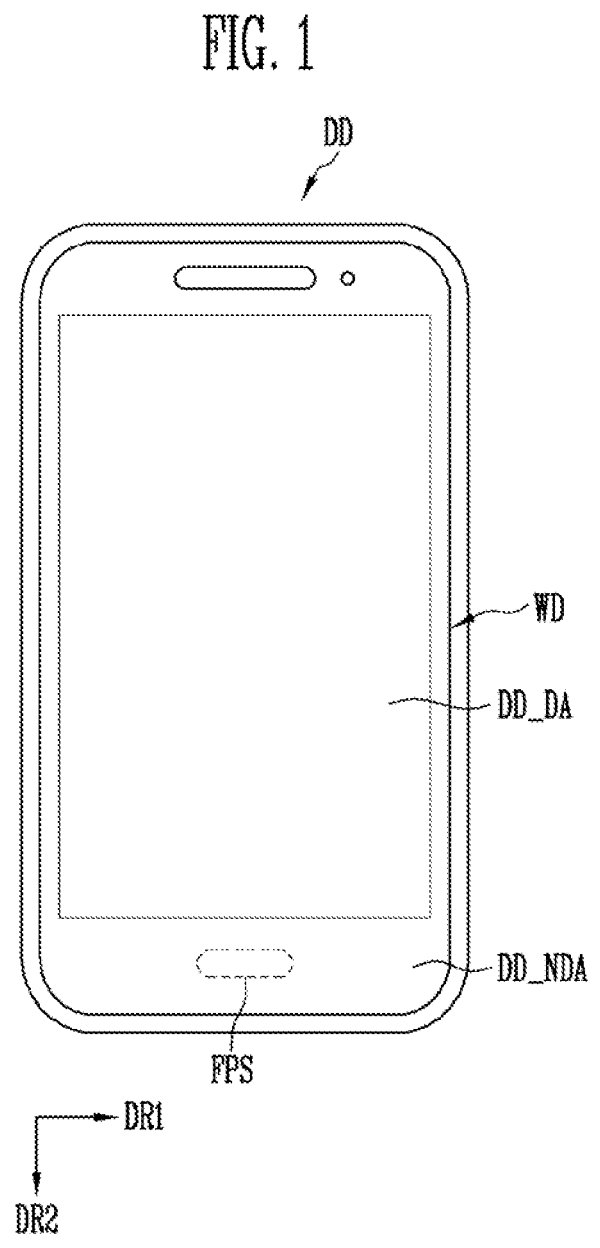

FIG. 1 is a schematic plan view illustrating a display device having a fingerprint sensor mounted therein.

Referring to FIG. 1, the display device DD may include a display area DD_DA that displays an image, and a non-display area DD_NDA provided on at least one side of the display area DD_DA. No image is displayed within the non-display area DD_NDA. A window WD may be disposed in a front direction (e.g., a direction in which the image is displayed) of the display device DD.

The window WD may minimize a failure of the display device DD, which is caused by impact, such as a shock, applied from the outside. The window WD may cover both the display area DD_DA and the non-display area DD_NDA.

The display device DD may include a plurality of hardware modules for implementing various functions of the display device DD. For example, a pressure sensor for sensing an intensity (or pressure) of a touch input of a user and/or a fingerprint sensor FPS for sensing a fingerprint of the user may be disposed at a back surface of the display device DD.

Figure 3:
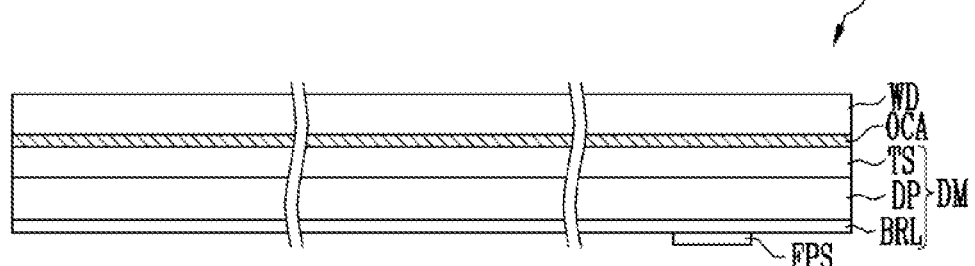
FIG. 3 is a schematic cross-sectional view illustrating the display device shown in FIG. 2.

FIG. 2 is a schematic perspective view of a display panel according to an exemplary embodiment of the present disclosure. FIG. 3 is a schematic cross-sectional view of the display device shown in FIG. 2.

Referring to FIGS. 2 and 3, the display device DD, according to exemplary embodiments of the present disclosure, may include a display module DM and a window WD.

The display device DD may be provided in various shapes. In an exemplary embodiment of the present disclosure, the display device DD may be provided in a rectangular plate shape having two pairs of sides parallel to each other, e.g. a pair of long sides and a pair of short sides. In an exemplary embodiment of the present disclosure, a case where the display device DD has a pair of long sides and a pair of short sides is illustrated for convenience of description. The extending direction of the long sides is represented as a first direction DR1, the extending direction of the short sides is represented as a second direction DR2, and the direction orthogonal to the extending direction of the long sides and the extending direction of the short sides is represented as a third direction DR3, which is illustrated as a direction of the projection of the displayed image.

The display device DD may include a display area DD_DA that displays an image and a non-display area DD_NDA provided on at least one side of the display area DD_DA. Thus the non-display area DD_NDA at least partially surrounds the display area DD_DA.

The non-display area DD_NDA is an area in which the image is not displayed. The non-display area DD_NDA may include a protrusion area protruding along at least one direction from a portion thereof. The protrusion area may protrude from sides of the non-display area DD_NDA.

In an exemplary embodiment of the present disclosure, one area of the display device DD may be set as a sensing area configured for sensing a fingerprint of a user, etc. For example, at least one area of the display area DD_DA of the display device DD may include the sensing area, but the present disclosure is not limited thereto. In some exemplary embodiments of the present disclosure, at least one area of the non-display area DD_NDA of the display device DD may include the sensing area. In an exemplary embodiment of the present disclosure, at least one area of the display area DD_DA of the display device DD and at least one area of the non-display area DD_NDA, which is continuous to the at least one area of the display area DD_DA, may include the sensing area.

At least a portion of the display device DD may be flexible so as to be bent or folded in the manner described herein without cracking or breaking, and the display device DD may be folded at the flexible portion. In an exemplary embodiment of the present disclosure, the term "folded" does not mean a fixed shape but means a shape deformable into another shape from the original shape, and includes a shape folded, curved or rolled like a roll along one or more specific lines, i.e., one or more folding lines.

The display device DD may include a bent area BA that has flexibility and is bent in one direction, and a flat area FA that is continuous in at least one side of the bent area BA and is flat without being bent. The flat area FA may or might not be flexible.

In an exemplary embodiment of the present disclosure, the bent area BA may be provided in the non-display area DD_NDA, but the present disclosure is not limited thereto. In some exemplary embodiments of the present disclosure, the bent area BA may be provided in the display area DD_DA. The flat area FA may include a first flat area FA1 and a second flat area FA2, which are spaced apart from each other with the bent area BA interposed therebetween. The first flat area FA1 may be provided in the display area DD_DA and at least a portion of the non-display area DD_NDA. The bent area BA may be continuous to the first flat area FA1, and may be provided within the non-display area DD_NDA. The second flat area FA2 may be continuous to the bent area BA, and may be provided in the non-display area DD_NDA. The bent area BA and the second flat area FA2 may be provided in the protrusion area of the non-display area DD_NDA.

The display device DD may be provided in a folded state such that one surface of the first flat area FA1 and one surface of the second flat area FA2 are located in parallel to each other and face each other, but the present disclosure is not limited thereto. In some exemplary embodiments of the present disclosure, the display device DD may be folded such that the surfaces of the first and second flat areas FA1 and FA2 form a predetermined angle (e.g., an acute angle, a right angle, or an obtuse angle) with the bent area BA interposed therebetween.

In an exemplary embodiment of the present disclosure, the protrusion area of the non-display area DD_NDA may be bent (or folded) along a folding line in the future. Thus, the protrusion area of the non-display area DD_NDA is bent (or folded), so that the width of a bezel can be decreased.

The display module DM may include a display panel DP and a touch sensor TS.

The touch sensor TS may be directly disposed on the display panel DP. In an exemplary embodiment of the present disclosure, the term "directly disposed" excludes attachment using a separate adhesive layer, and means formation through a continuous process. However, the present disclosure is not limited thereto, and another layer such as an adhesive layer or a substrate may be interposed between the display panel DP and the touch sensor TS.

The display panel DP may display visual information, e.g., text, video, and/or pictures. The display may be a two-dimensional or a three-dimensional image, etc. Hereinafter the visual information is referred to as an "image." The kind of the display panel DP is not particularly limited, but may be one or more of the display types listed herein. For example, the display panel DP may be a self-luminescent display panel such as an organic light emitting display panel (OLED panel). In addition, non-luminescent display panels such as a liquid crystal display panel (LCD panel), an electrophoretic display panel (EPD panel), and an electro-wetting display panel (EWD panel) may be used as the display panel DP. When a non-luminescent display panel is used as the display panel DP of the display device DD, according to exemplary embodiments of the present disclosure, the display device DD may include a backlight unit for supplying light to the display panel DP.

The touch sensor TS may be disposed on a surface of the display panel DP, from which an image is emitted, to receive a touch input of a user. The touch sensor TS may be configured to recognize a touch event of the display device DD. The touch event may be created by the user touching the display device DD with a finger or a separate input means, such as a stylus or the like. For example, the touch sensor TS may be configured to recognize a touch event, using a capacitive method.

The window WD for protecting an exposed surface of the display module DM may be provided on the display module DM. The window WD may be configured to protect the display module DM from external impact, and may provide an input surface and/or a display surface to a user. The window WD may be coupled to the display module DM through an optically transparent adhesive member OCA.

The window WD may have a multi-layered structure that may include a glass substrate, a plastic film, and/or a plastic substrate. The multi-layered structure may be formed through a continuous process or an adhesion process using an adhesive layer. The whole or a portion of the window WD may be flexible.

In an exemplary embodiment of the present disclosure, the display module DM may include a protective layer BRL provided and/or formed on a lower surface of the display panel DP, e.g., a surface on which the touch sensor TS is not disposed. The protective layer BRL may prevent oxygen, moisture, and the like from being introduced into the display panel DP from the outside, and be provided in the form of a single layer or multi-layer. In some exemplary embodiments of the present disclosure, the protective layer BRL may be configured in a film shape, to further ensure flexibility of the display module DM. In addition, an adhesive layer (or gluing layer) may be formed and/or provided between the display panel DP and the protective layer BRL, so that the display panel DP and the protective layer BRL can be firmly coupled to each other.

The display module DM may further include a polarizing film provided and/or formed between the touch sensor TS and the display panel DP. The polarizing film may polarize light emitted from the display panel DP along a polarization axis.

The display device DD may further include a fingerprint sensor FPS.

The fingerprint sensor FPS may be a sensing element for recognizing a fingerprint of a user. Although a case where the fingerprint sensor FPS is disposed on a lower surface (or back surface) of the display module DM is illustrated for convenience of description, the present disclosure is not limited thereto. In some exemplary embodiments of the present disclosure, the fingerprint sensor FPS may be disposed on an upper surface (or front surface) of the display panel DP. The fingerprint sensor FPS may be connected to a fingerprint sensor driver through a separate line, a flexible printed circuit board, a tape carrier package, a connector, a chip on film, or the like.

The fingerprint sensor FPS may be a light sensing type sensor or ultrasonic sensing type sensor. The fingerprint sensor FPS, according to exemplary embodiments of the present disclosure, may be the ultrasonic sensing type sensor. The fingerprint sensor FPS may be configured to recognize a fingerprint of a finger of a user, which is in contact with the display module DM and/or the window WD, by directing an ultrasonic signal onto the finger of the user and receiving intensities of the ultrasonic signal changed depending on a ridge or valley of the fingerprint of the finger of the user. The fingerprint sensor FPS may be configured to recognize a fingerprint of a finger of a user not only when the finger of the user is in contact with the display module DM and/or the window WD but also when the user moves in a state in which the finger of the user is in contact with the display module DM and/or the window WD.

Figure 4:
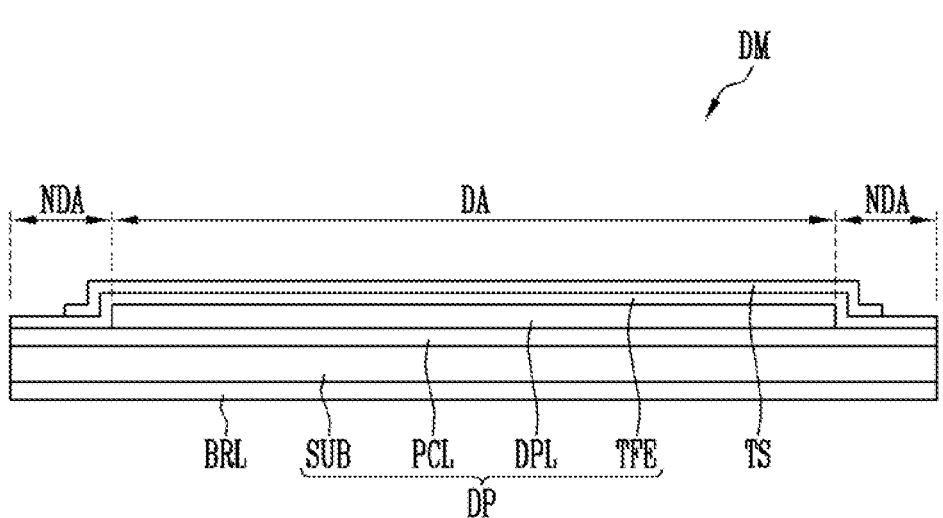
FIG. 4 is a schematic cross-sectional view illustrating a display module shown in FIG. 3.

FIG. 4 is a schematic cross-sectional view of the display module shown in FIG. 3.

Referring to FIGS. 1 to 4, the display module DM may include a display panel DP, a touch sensor TS, and a protective layer BRL.

The display panel DP may include a substrate SUB, a pixel circuit layer PCL disposed on the substrate SUB, a display element layer DPL disposed on the pixel circuit layer PCL, and a thin film encapsulation layer TFE disposed on the display element layer DPL.

The substrate SUB may be made of an insulative material such as glass or resin. The substrate SUB may be made of a flexible material to be bendable or foldable. The substrate SUB may have a single- or multi-layered structure. For example, the flexible material may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. However, the material constituting the substrate SUB may be variously changed, and the substrate SUB may be made of a Fiber Reinforced Plastic (FRP), etc. In an exemplary embodiment of the present disclosure, the substrate SUB may be made of a flexible material.

The pixel circuit layer PCL may include a plurality of insulating layers, a plurality of conductive layers, and a semiconductor layer. The plurality of conductive layers of the pixel circuit layer PCL may constitute signal lines or a pixel driving circuit.

The display element layer DPL may include a light emitting element for emitting light.

The thin film encapsulation layer TFE encapsulates the display element layer DPL. The thin film encapsulation layer TFE may be provided as a single layer, or may be provided as a multi-layer. The thin film encapsulation layer TFE may include a plurality of insulating layers covering the display element layer DPL including the light emitting element. For example, the thin film encapsulation layer TFE may include at least one inorganic layer and at least one organic layer. For example, the thin film encapsulation layer TFE may have a structure in which the inorganic and organic layers are alternately stacked. In some cases, the thin film encapsulation layer TFE may be an encapsulation substrate that is disposed on the display element layer DPL and is joined with the substrate SUB through a sealant.

The touch sensor TS may include a plurality of touch electrodes and a plurality of sensing lines. The touch electrodes and the sensing lines may have a single- or multi-layered structure.

The touch electrodes and the sensing lines may include indium tin oxide (ITO), indium zinc oxide (IZO), zinc oxide (ZnO), indium tin zinc oxide (ITZO), PEDOT, metal nano wire, and/or graphene. The touch electrodes and the sensing lines may include a metal layer, e.g., molybdenum, silver, titanium, copper, aluminum, and/or any alloy thereof. The touch electrodes and the sensing lines may have the same layer structure, or have different layer structures. The touch sensor TS will be described in detail later with reference to FIGS. 8 to 11B.

The protective layer BRL may be disposed on one surface of the display panel DP, e.g., the other surface opposite to a surface on which the touch sensor TS is provided and/or formed. The protective layer BRL may be conducted to protect the display panel DP by absorbing and/or dispersing external impact applied to the display panel DP. Also, the protective layer BRL may prevent moisture, oxygen, and the like from penetrating into the display panel DP from the outside.

The protective layer BRL may be provided in the form of a plastic film including at least one organic layer. The plastic film may include a thermoplastic polymer resin such as polycarbonate (PC), polyimide (PI), polyethersulfone (PES), polyarylate (PAR), polyethylene naphthalate (PEN), polyethylene terephthalate (PET), and/or cycloolefin copolymer, which is high transparency and excellent heat insulating properties, a thermosetting polymer resin such as epoxy, unsaturated polyester, phenol (PF), silicon, and/or polyurethane, and/or the like. In an exemplary embodiment of the present disclosure, the protective layer BRL need not be manufactured by the above-described materials, and may be manufactured by a suitable material selected according to a design condition of the display panel, etc. among materials capable of protecting the substrate SUB disposed on the top thereof.

Figure 5:
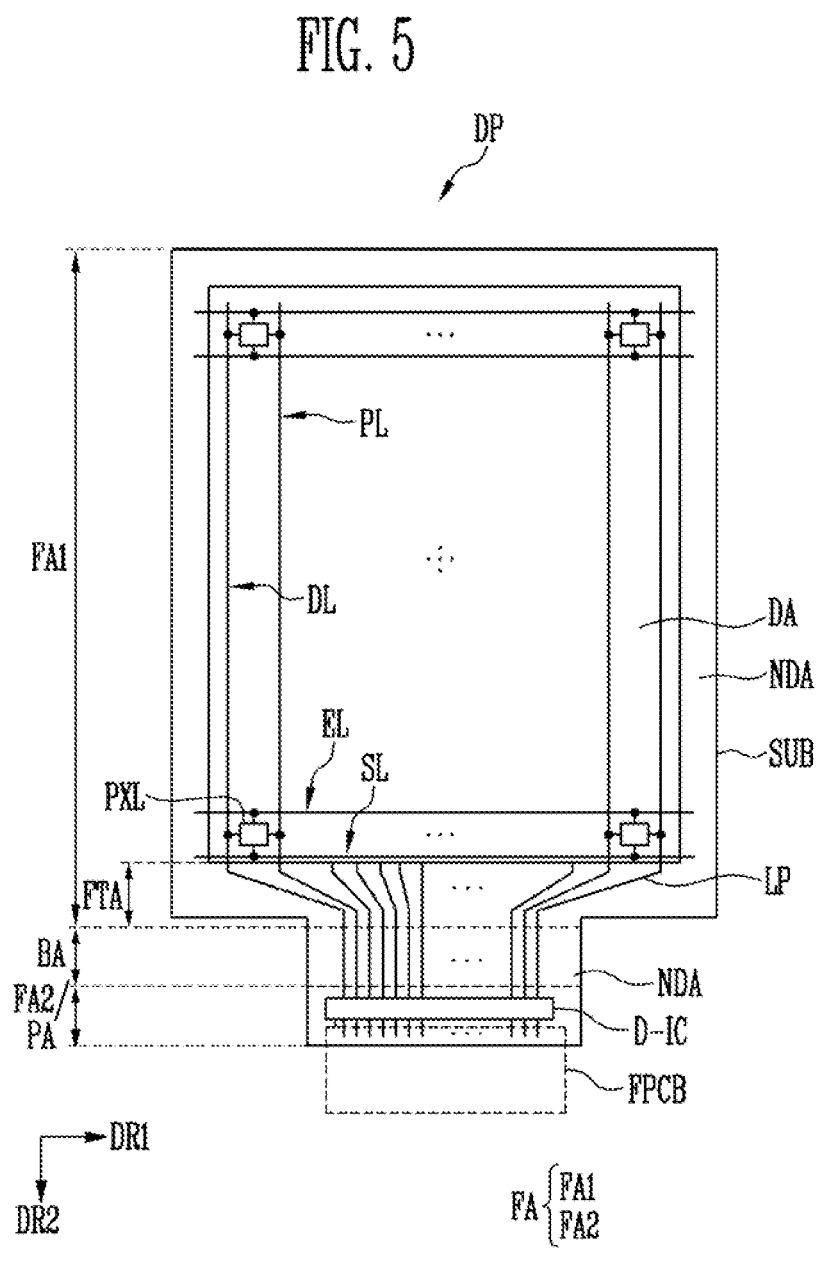

FIG. 5 is a plan view schematically illustrating the display panel shown in FIG. 4.

Referring to FIGS. 1 to 5, the display panel DP may include a display area DA and a non-display area NDA. The display area DA and the non-display area NDA of the display panel DP correspond to the display area DD_DA and the non-display area DD_NDA of the display device DD, respectively. For example, the display area DA of the display panel DP may correspond to the display area DD_DA of the display device DD, and the non-display area NDA of the display panel DP may correspond to the non-display area DD_NDA of the display device DD.

In an exemplary embodiment of the present disclosure, the display area DA and the non-display area NDA of the display panel DP are not necessarily identical to the display area DD_DA and the non-display area DD_NDA of the display device DD, but may be changed depending on the structure and/or design of the display panel DP. The non-display area NDA of the display panel DP may protrude along a second direction DR2 from the display area DA of the display panel DP.

The display panel DP may include a driving circuit D-IC, a plurality of signal lines, a plurality of pixels PXL, and a line part LP.

The signal lines may be disposed in the display area DA of the display panel DP. The signal lines may include scan lines SL, data lines DL, emission control lines EL, and power lines PL. The scan lines SL are respectively connected to corresponding pixels PXL among the pixels PXL, and the data lines DL are respectively connected to corresponding pixels PXL among the pixels PXL. Each of the emission control lines EL may be arranged in parallel to a corresponding scan line SL among the scan lines SL. The power lines PL are connected to the pixels, and may transfer first power source to each pixel PXL.

The area in which the pixels PXL may be defined as the display area DA. In an exemplary embodiment of the present disclosure, the non-display area NDA may be defined along an edge of the display area DA. Each pixel PXL may include a light emitting element emitting light and a pixel driving circuit connected to the light emitting element.

Each of the pixels PXL is connected to a corresponding scan line SL among the scan lines SL and a corresponding data line DL among the data lines DL. In an exemplary embodiment of the present disclosure, the pixels PXL may be arranged in a matrix form along rows extending in a first direction DR1 and columns extending in the second direction DR2 intersecting the first direction DR1. However, the arrangement form of the pixels PXL is not particularly limited, and the pixels PXL may be arranged in various forms. In some exemplary embodiments of the present disclosure, pixels PXL may be arranged such that their arrangement direction becomes a row direction or such that their arrangement direction oblique to one direction becomes a row direction.

Each of the pixels PXL may include a plurality of sub-pixels capable of expressing any one of a set of primary colors such as red, green, and blue. The color that each of the sub-pixels can express is not limited to the red, the green, and the blue, and each of the sub-pixels may express various colors including secondary primary colors such as white or yellow, cyan, and magenta, in addition to the red, the green, and the blue.

Each of the pixels PXL may be a light emitting element including an organic emitting layer. However, the present disclosure is not limited thereto, and may be implemented in various forms of a liquid crystal element, an electrophoretic element, an electro-wetting element, and the like within the scope of the present disclosure.

The driving circuit D-IC may be provided in the non-display area NDA of the display panel DP. The driving circuit D-IC may include a scan driving circuit that generates a plurality of scan signals and transfers the scan signals to the scan lines SL, a data driving circuit that transfers a data signal to the data lines DL, an emission control driving circuit that transfers an emission control signal to the emission control lines EL, and the like.

The driving D-IC may include at least one transistor formed through the same process, e.g., a Low Temperature Polycrystalline Silicon (LTPS) or Low Temperature Polycrystalline Oxide (LTPO) as the pixel driving circuits for driving the pixels PXL. One end of the driving circuit D-IC may be disposed in the non-display area NDA, and be connected to one end of each of the data lines DL and the power lines PL through the line part LP.

The line part LP may include fan-out lines that are provided in the non-display area NDA of the display panel DP and electrically connect the signal lines disposed in the display area DA to the driving circuit D-IC located in the non-display area NDA. The area in which the line part LP is provided in the non-display area NDA may be a fan-out area FTA.

A flexible printed circuit board FPCB electrically connected to the driving circuit D-IC may be attached in the protruding non-display area NDA of the display panel DP. The area in which the driving circuit D-IC is disposed in the non-display area NDA may be a pad area PA, and the flexible printed circuit board FPCB may be attached in at least one side of the pad area PA.

Meanwhile, the substrate SUB included in the display panel DP may be flexible, and may be folded at the flexible portion. For example, the substrate SUB may include a bent area BA in which the substrate SUB can be folded in one direction and a flat area FA that is provided in at least one side of the bent area BA and is not folded. The flat area FA of the substrate SUB may correspond to the flat area FA of the display device DD. The flat area FA of the substrate SUB may include a first flat area FA1 and a second flat area FA2, which are provided with the bent area BA interposed therebetween.

The first flat area FA1 of the substrate SUB may correspond to the display area DA, and correspond to even at least a portion of the non-display area NDA, e.g., the fan-out area FTA. The bent area BA may be located between the first flat area FA1 and the second flat area FA2, and may correspond to the non-display area NDA. The second flat area FA2 may be located at the outside of the bent area BA, and may correspond to the pad area PA of the non-display area NDA.

Figure 6:
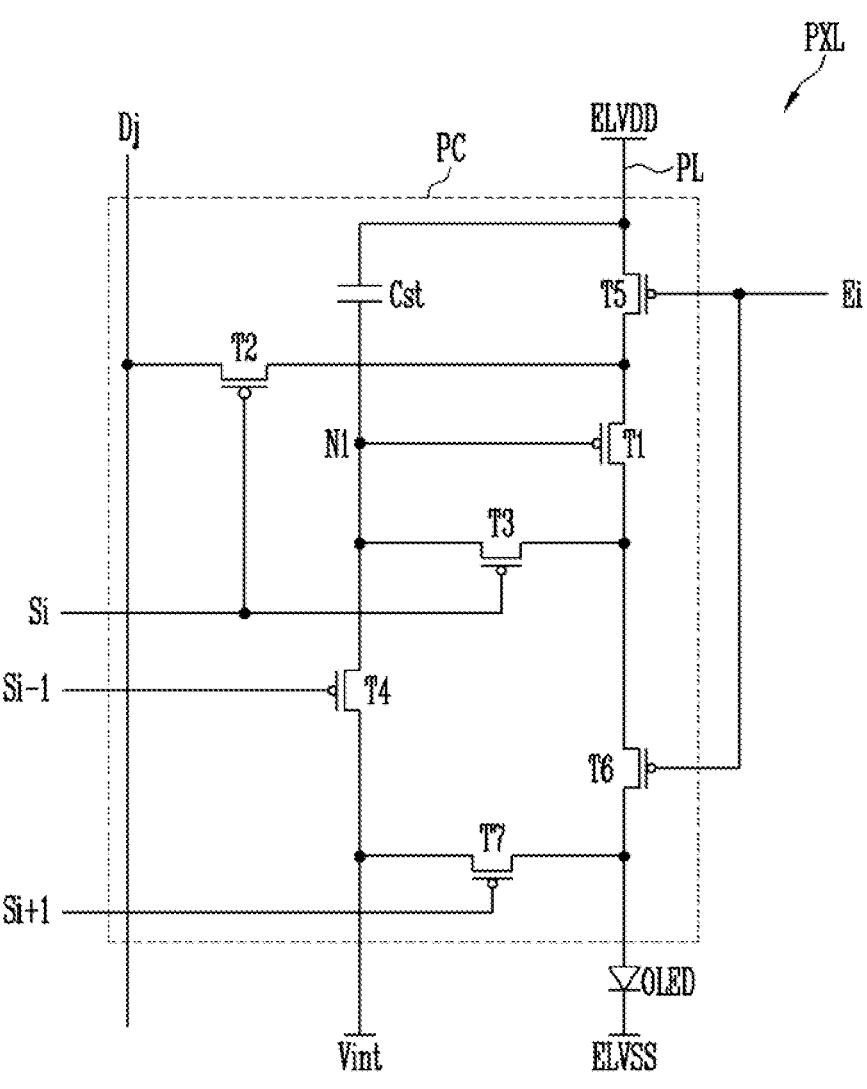
FIG. 6 is an equivalent circuit diagram illustrating one pixel shown in FIG. 5.

FIG. 6 is an equivalent circuit diagram illustrating one pixel shown in FIG. 5.

For convenience of description, a pixel that is disposed on an $i^{th}$ row and a $j^{th}$ column, and is connected to a $j^{th}$ data line Dj, an $(i-1)^{th}$ scan line Si−1, an $i^{th}$ scan line Si, and an $(i+1)^{th}$ scan line Si+1 is illustrated in FIG. 6.

Referring to FIGS. 1 to 6, the pixel PXL, according to exemplary embodiments of the present disclosure, may include a light emitting element OLED and a pixel driving circuit PC connected to the light emitting element OLED to drive the light emitting element OLED. The pixel driving circuit PC may include first to seventh transistor T1 to T7 and a storage capacitor Cst.

An anode electrode of the light emitting element OLED may be connected to the first transistor T1 via the sixth transistor T6, and a cathode electrode of the light emitting element OLED may be connected to a line to which a second power source ELVSS is applied.

The light emitting element OLED may generate light with a predetermined luminance corresponding to an amount of current supplied from the first transistor T1. A first power source ELVDD applied to a power line PL such that current can flow through the light emitting element OLED may be set to a voltage higher than that of the second power source ELVSS.

A source electrode of the first transistor (driving transistor) T1 is connected to the power line PL to which the first power source ELVDD is applied via the fifth transistor T5, and a drain electrode of the first transistor T1 is connected to the anode electrode of the light emitting element OLED via the sixth transistor T6. The first transistor T1 controls an amount of current flowing from the first power source ELVDD to the second power source ELVSS via the light emitting element OLED, corresponding to a voltage of a first node N1 that is a gate electrode thereof.

The second transistor (switching transistor) T2 is connected between the $j^{th}$ data line Dj and the source electrode of the first transistor T1. In addition, a gate electrode of the second transistor T2 is connected to the $i^{th}$ scan line Si. The second transistor T2 is turned on when a scan signal is supplied to the $i^{th}$ scan line Si, to electrically connect the $j^{th}$ data line Dj to the source electrode of the first transistor T1.

The third transistor T3 is connected between the drain electrode of the first transistor T1 and the first node N1. In addition, a gate electrode of the third transistor T3 is connected to the $i^{th}$ scan line Si. The third transistor T3 is turned on when a scan signal is supplied to the $i^{th}$ scan line Si, to electrically connect the drain electrode of the first transistor T1 to the first node N1. Therefore, the first transistor T1 is connected in a diode form when the third transistor T3 is turned on.

The fourth transistor T4 is connected between the first node N1 and a line to which an initialization power source Vint is applied. In addition, a gate electrode of the fourth transistor T4 is connected to the $(i-1)^{th}$ scan line Si−1. The fourth transistor T4 is turned on when a scan signal is supplied to the $(i-1)^{th}$ scan line Si−1, to supply the voltage of the initialization power source Vint to the first node N1.

The initialization power source Vint may be set to a voltage lower than that of a data signal.

The fifth transistor T5 is connected between the first power source ELVDD and the source electrode of the first transistor T1. In addition, a gate electrode of the fifth transistor T5 is connected to an $i^{th}$ emission control line Ei. The fifth transistor T5 is turned off when an emission control signal is supplied to the $i^{th}$ emission control line Ei, and is turned on otherwise.

The sixth transistor T6 is connected between the drain electrode of the first transistor T1 and the anode electrode of the light emitting element OLED. In addition, a gate electrode of the sixth transistor T6 is connected to the $i^{th}$ emission control line Ei. The sixth transistor T6 is turned off when an emission control signal is supplied to the $i^{th}$ emission control line Ei, and is turned on otherwise.

The seventh transistor T7 is connected between the line to which the initialization power source is applied and the anode electrode of the light emitting element OLED. In addition, a gate electrode of the seventh transistor T7 is connected to the $(i+1)^{th}$ scan line Si+1. The seventh transistor T7 is turned on when a scan signal is supplied to the $(i+1)^{th}$ scan line Si+1, to supply the voltage of the initialization power source Vint to the anode electrode of the light emitting element OLED.

The storage capacitor Cst is connected between the first power source ELVDD and the first node N1. The storage capacitor Cst may store a voltage corresponding to the data signal and a threshold voltage of the first transistor T1.

Figure 7:
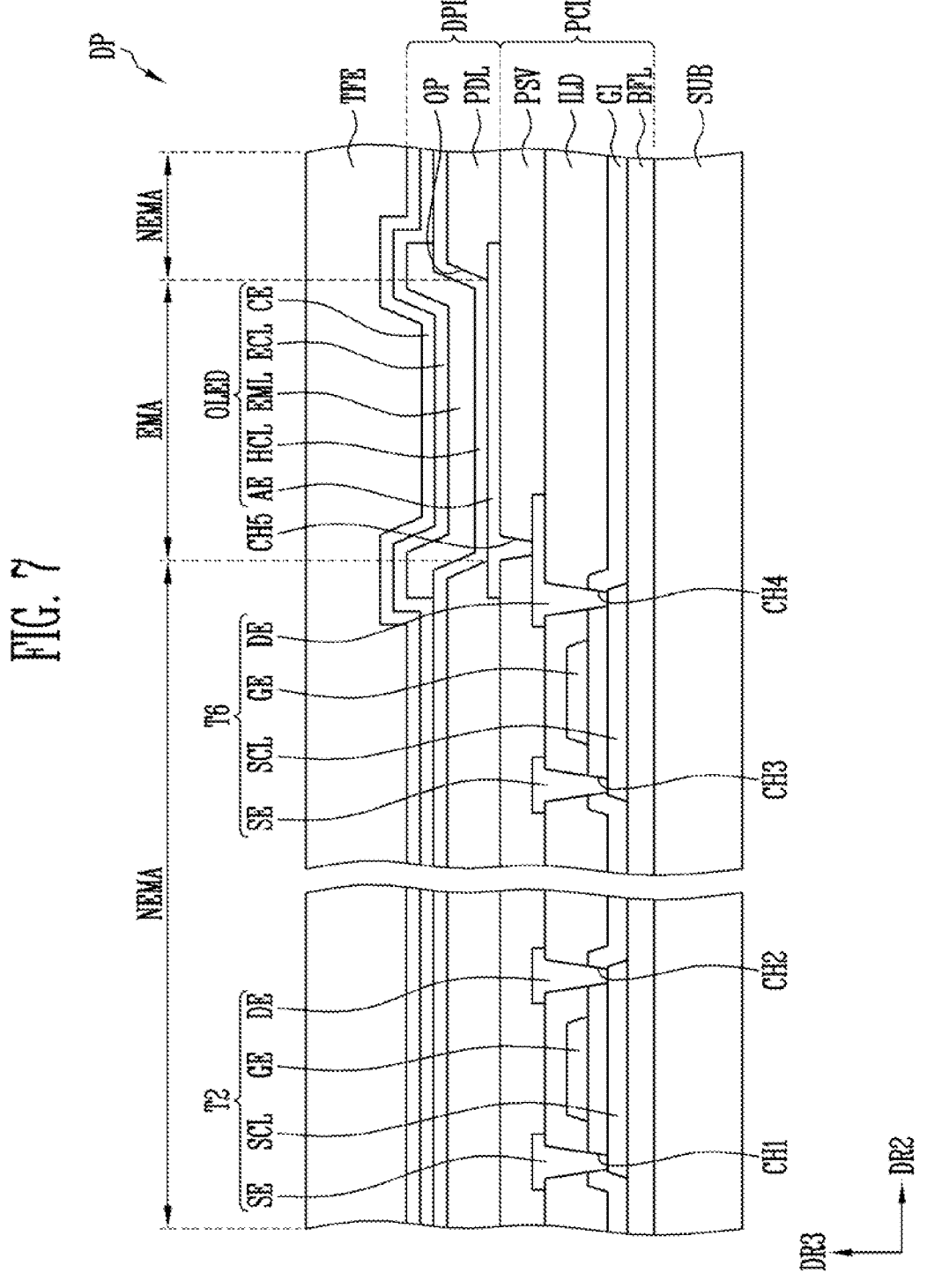
FIG. 7 is an enlarged cross-sectional view of the display panel shown in FIG. 5.

FIG. 7 is an enlarged cross-sectional view of the display panel shown in FIG. 5.

For convenience of description, only the section of a portion corresponding to each of the second and sixth transistors among the first to seventh transistors shown in FIG. 6 is illustrated in FIG. 7.

Referring to FIGS. 1 to 7, the display panel DP includes a substrate SUB, a pixel circuit layer PCL, a display element layer DPL, and a thin film encapsulation layer TFE.

The substrate SUB may be made of an insulative material such as glass, organic polymer, quartz, or the like. The substrate SUB may be made of a flexible material to be bendable or foldable. The substrate SUB may have a single- or multi-layered structure.

The pixel circuit layer PCL may include a buffer layer BFL, second and sixth transistors T2 and T6, and a passivation layer PSV.

The buffer layer BFL may be disposed on the substrate SUB, and prevent an impurity from being diffused into the second and sixth transistors T2 and T6. The buffer layer BFL may be provided in a single layer, but may alternatively be provided in a multi-layer including at least two layers. The buffer layer BFL may be omitted according to the material and process conditions of the substrate SUB.

Each of the second and sixth transistors T2 and T6 may include a semiconductor layer SCL, a gate electrode GE, a source electrode SE, and a drain electrode DE.

The semiconductor layer SCL of each of the second and sixth transistors T2 and T6 may be disposed on the buffer layer BFL. The semiconductor layer SCL may include first and second regions, which are respectively in contact with the source electrode SE and the drain electrode DE. A region between the first region and the second region may be a channel region. In an exemplary embodiment of the present disclosure, the first region may be one of a source region and a drain region, and the second region may be the other of the source region and the drain region.

The semiconductor layer SCL may be a semiconductor pattern made of poly-silicon, amorphous silicon, oxide semiconductor, etc. The channel region is an intrinsic semiconductor pattern undoped with an impurity. The impurity may include impurities such as an n-type impurity, a p-type impurity, and other metals. Each of the first and second regions may be a semiconductor pattern doped with the impurity.

The gate electrode GE of each of the second and sixth transistors T2 and T6 may be disposed on a corresponding semiconductor layer SCL with a gate insulating layer GI interposed therebetween.

The source electrode SE of each of the second and sixth transistors T2 and T6 may be in contact with one of the first and second regions of a corresponding semiconductor layer SCL through a contact hole penetrating an interlayer insulating layer ILD and the gate insulating layer GI. In an exemplary embodiment of the present disclosure, the source electrode SE of the second transistor T2 may be in contact with the first region of the corresponding semiconductor layer SCL through a first contact hole CH1 penetrating the interlayer insulating layer ILD and the gate insulating layer GI, and the source electrode SE of the sixth transistor T6 may be in contact with the first region of the corresponding semiconductor layer SCL through a third contact hole CH3 penetrating the interlayer insulating layer ILD and the gate insulating layer GI.

The drain electrode DE of each of the second and sixth transistors T2 and T6 may be in contact with the other of the first and second regions of a corresponding semiconductor layer SCL through a contact hole penetrating the interlayer insulating layer ILD and the gate insulating layer GI. In an exemplary embodiment of the present disclosure, the drain electrode DE of the second transistor T2 may be in contact with the second region of the corresponding semiconductor layer SCL through a second contact hole CH2 penetrating the interlayer insulating layer ILD and the gate insulating layer GI, and the drain electrode DE of the sixth transistor T6 may be in contact with the second region of the corresponding semiconductor layer SCL through a fourth contact hole CH4 penetrating the interlayer insulating layer ILD and the gate insulating layer GI.

In the above-described embodiment, the source and drain electrodes SE and DE of each of the second and sixth transistors T2 and T6 are described as separate electrodes electrically connected to the semiconductor layer SCL, but the present disclosure is not limited thereto. In some exemplary embodiments of the present disclosure, the source electrode SE of each of the second and sixth transistors T2 and T6 may be one of the first and second regions adjacent to the channel region of a corresponding semiconductor layer SCL, and the drain electrode DE of each of the second and sixth transistors T2 and T6 may be the other of the first and second regions adjacent to the channel region of the corresponding semiconductor layer SCL. The drain electrode DE of the sixth transistor T6 may be electrically connected to a first electrode AE of a light emitting element OLED through a bridge electrode, a contact electrode, or the like.

In an exemplary embodiment of the present disclosure, each of the interlayer insulating layer ILD and the gate insulating layer GI may be configured with an inorganic insulating layer including an inorganic material or an organic insulating layer including an organic material.

The passivation layer PSV may be provided over the second and sixth transistors T2 and T6 to cover the second and the sixth transistors T2 and T6. The passivation layer PSV may include a fifth contact hole CH5 through which a portion of the drain electrode DE of the sixth transistor T6 is exposed to the outside.

The display element layer DPL may include a light emitting element OLED that is disposed on the passivation layer PSV and emits light.

The light emitting element OLED may include first and second electrodes AE and CE and an emitting layer EML disposed between the two electrodes AE and CE. Any one of the first and second electrodes AE and CE may be an anode electrode, and the other of the first and second electrodes AE and CE may be a cathode electrode. For example, the first electrode AE may be the anode electrode, and the second electrode CE may be the cathode electrode. When the light emitting element OLED is a top-emission organic light emitting element, the first electrode AE may be a reflective electrode, and the second electrode CE may be a transmissive electrode. In an exemplary embodiment of the present disclosure, a case where the light emitting element OLED is the top-emission organic light emitting element, and the first electrode AE is the anode electrode is described as an example.

The first electrode AE may be electrically connected to the drain electrode DE of the sixth transistor T6 through the fifth contact hole CH5 penetrating the passivation layer PSV. The first electrode AE may include a reflective layer capable of reflecting light and a transparent conductive layer disposed on the top or bottom of the reflective layer. At least one of the transparent conductive layer and the reflective layer may be electrically connected to the drain electrode DE of the sixth transistor T6.

The display element layer DPL may further include a pixel defining layer PDL having an opening OP for exposing a portion of the first electrode AE, e.g., an upper surface of the first electrode AE.

Each pixel PXL provided in the display panel DP may be disposed in a pixel area on a plane. In an exemplary embodiment of the present disclosure, the pixel area may include an emission area EMA and a non-emission area NEMA adjacent to the emission area EMA. The non-emission area NEMA may at least partially surround the emission area EMA. In an exemplary embodiment of the present disclosure, the emission area EMA may be defined corresponding to a partial region of the first electrode AE, which is exposed by the opening OP.

The display element layer DPL may include a hole control layer HCL and an electron control layer ECL.

The hole control layer HCL may be commonly disposed in the emission area EMA and the non-emission area NEMA. A common layer such as the hole control layer HCL may be formed in a plurality of pixels PXL.

The emitting layer EML is disposed on the hole control layer HCL. The emitting layer EML may be disposed in a region corresponding to the opening OP. For example, the emitting layer EML may be separated and may be provided in a plurality of pixels PXL. The emitting layer EML may include an organic material and/or an inorganic material. In an exemplary embodiment of the present disclosure, the patterned emitting layer EML is exemplarily illustrated. However, in some exemplary embodiments of the present disclosure, the emitting layer EML may be commonly provided in the pixels PXL. The color of light generated in the emitting layer EML may be one of red, green, blue, and white. However, the present invention is not limited thereto. For example, the color of the light generated in the emitting layer EML may be one of magenta, cyan, and yellow.

The electron control layer ECL may be disposed on the emitting layer EML. The electron control layer ECL may be commonly formed in the pixels PXL, and function to inject and/or transport electrons to the emitting layer EML.

The second electrode CE may be disposed on the electron control layer ECL. The second electrode CE may be commonly provided in the pixels PXL.

The thin film encapsulation layer TFE covering the second electrode CE may be provided over the second electrode CE.

The thin film encapsulation layer TFE may be provided in a single layer, but may alternatively be provided in a multi-layer. The thin film encapsulation layer TFE may include a plurality of insulating layers covering the light emitting element OLED. For example, the thin film encapsulation layer TFE may include at least one inorganic layer and at least one organic layer. For example, the thin film encapsulation layer TFE may have a structure in which the inorganic and organic layers are alternately stacked.

Figure 8:
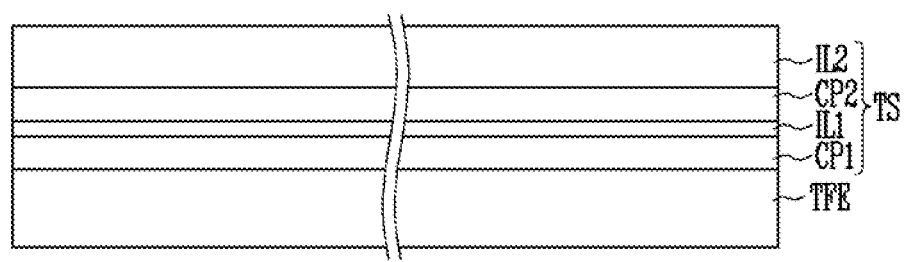
FIG. 8 is a schematic cross-sectional view of a touch sensor shown in FIG. 3.

FIG. 8 is a schematic cross-sectional view of the touch sensor shown in FIG. 3.

Referring to FIGS. 1 to 8, the touch sensor TS, according to exemplary embodiments of the present disclosure, may include a first conductive pattern CP1, a first insulating layer ILL a second conductive pattern CP2, and a second insulating layer IL2.

The first conductive pattern CP1 may be directly disposed on the thin film encapsulation layer TFE of the display panel DP, but the present disclosure is not limited thereto. In some exemplary embodiments of the present disclosure, another inorganic insulating layer may be disposed between the first conductive pattern CP1 and the thin film encapsulation layer TFE. The first conductive pattern CP1 may be directly disposed on the inorganic insulating layer.

Each of the first and second conductive patterns CP1 and CP2 may have a single-layered structure, or have a multi-layered structure in which layers are stacked in the thickness direction thereof. The conductive pattern having the single-layered structure may include a metal layer or transparent conductive layer. The metal layer may include molybdenum, silver, titanium, copper, aluminum, and/or alloys thereof. The transparent conductive layer may include a transparent conductive oxide such as indium tin oxide (ITO), indium zinc oxide (IZO), zinc oxide (ZnO), and/or indium tin zinc oxide (ITZO). In addition, the transparent conductive layer may include PEDOT, metal nano wire, and graphene.

The conductive pattern having the multi-layered structure may include multi-layered metal layers. The multi-layered metal layers may have, for example, a triple layered structure of titanium/aluminum/titanium. The conductive pattern having the multi-layered structure may include a single-layered metal layer and a transparent conductive layer. The conductive pattern having the multi-layered structure may include multi-layered metal layers and a transparent conductive layer.

In an exemplary embodiment of the present disclosure, each of the first and second conductive patterns CP1 and CP2 may include touch electrodes and sensing lines.

Each of the first insulating layer IL1 and the second insulating layer IL2 may be configured with an inorganic insulating layer including an inorganic material or an organic insulating layer including an organic material. The inorganic insulating layer may include aluminum oxide, titanium oxide, silicon oxide or silicon nitride, silicon oxynitride, zirconium oxide, and/or hafnium oxide. The organic insulating layer may include acryl-based resin, methacryl-based resin, polyisoprene, vinyl-based resin, epoxy-based resin, urethane-based resin, cellulose-based resin, siloxane-based resin, polyimide-based resin, polyamide-based resin, and/or perylene-based resin.

Figure 9:
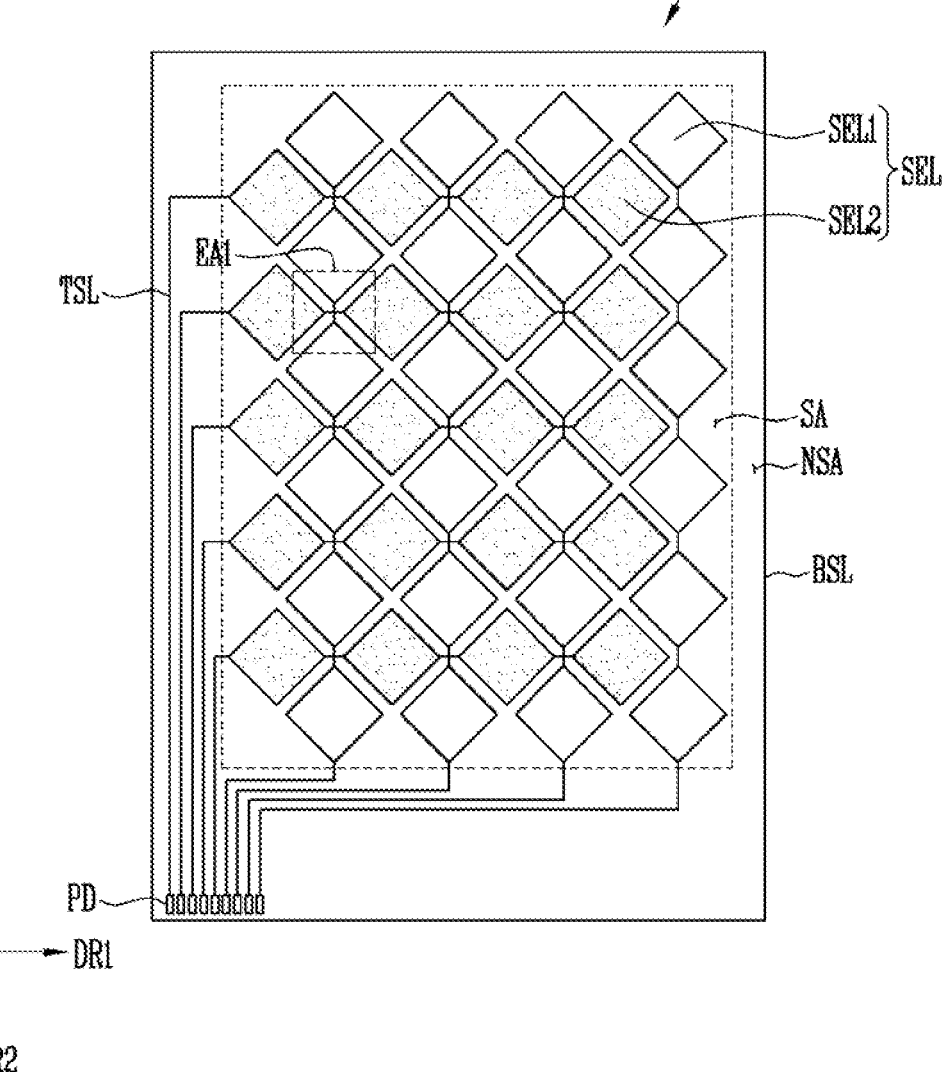
FIG. 9 is a plan view schematically illustrating the touch sensor shown in FIG. 3.
Figure 10:
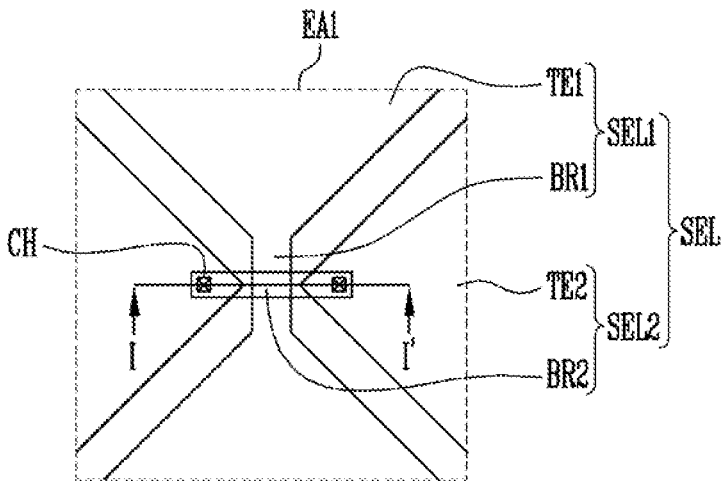
FIG. 10 is an enlarged plan view schematically illustrating portion EA1 shown in FIG. 9.
Figure 11A:
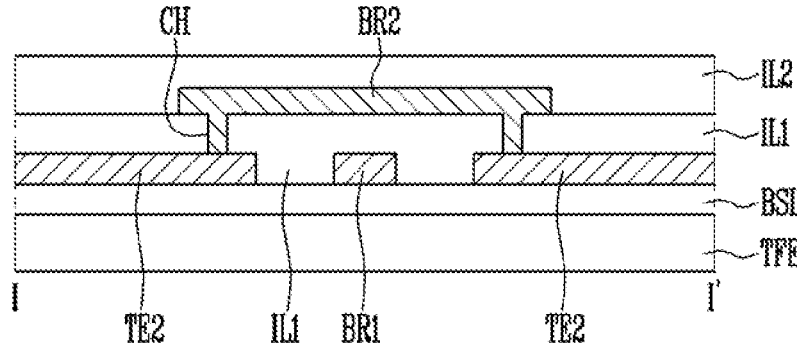
FIG. 11A is a cross-sectional view taken along line I-I' shown in FIG. 10.
Figure 11B:
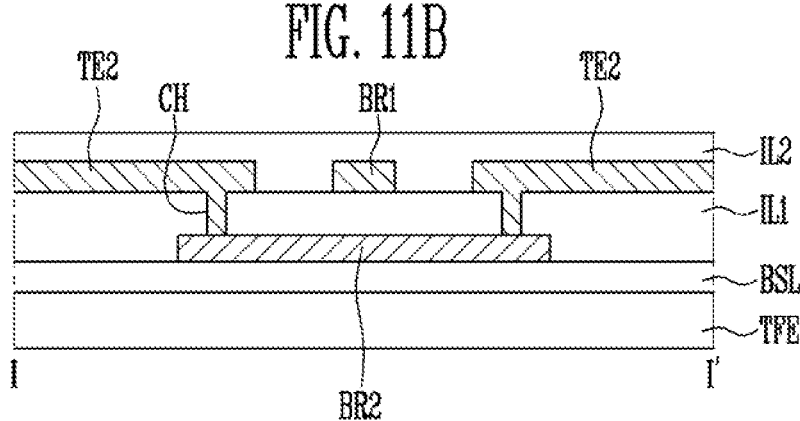
FIG. 11B illustrates a second touch electrode and first and second bridge patterns, which are shown in FIG. 11A, which is a cross-sectional view corresponding to the line I-I' shown in FIG. 10.

FIG. 9 is a plan view schematically illustrating the touch sensor shown in FIG. 3. FIG. 10 is an enlarged plan view schematically illustrating portion EA1 shown in FIG. 9. FIG. 11A is a cross-sectional view taken along line I-I' shown in FIG. 10. FIG. 11B illustrates a second touch electrode and first and second bridge patterns, which are shown in FIG. 11A, which is a cross-sectional view corresponding to the line I-I' shown in FIG. 10.

Referring to FIGS. 1 to 10, 11A, and 11B, the touch sensor TS, according to an exemplary embodiment of the present disclosure, may include a base layer BSL including a sensing area SA and a non-sensing area NSA.

The sensing area SA may overlap with the display area DA of the display panel DP, and be provided in a shape substantially identical to that of the display area DA. The non-sensing area NSA may overlap with the non-display area NDA of the display panel DP.

A plurality of touch sensing cells SEL may be provided in the sensing area SA, and touch sensing lines TSL that connect the touch sensing cells SEL to a sensing pad part may be provided in the non-sensing area NSA. The sensing pad part may include a plurality of pads PD. Each of the pads PD may be electrically connected a corresponding touch sensing cell SEL through a corresponding touch sensing line TSL among the touch sensing lines TSL.

The touch sensing cells SEL may include a plurality of first touch sensing cells SEL1 extending in a first direction DR1 to constitute touch electrode rows and a plurality of second touch sensing cells SEL2 extending in a second direction DR2 intersecting the first direction DR1 to constitute touch electrode columns. The first touch sensing cells SEL1 and the second touch sensing cells SEL2 may be electrically insulated from each other.

The first touch sensing cells SEL1 may include a plurality of first touch electrodes TE1 included in the touch electrode rows and a first bridge pattern BR1 that electrically and/or physically connects adjacent first touch electrodes TE1. The second touch sensing cells SEL2 may include a plurality of second touch electrodes TE2 included in the touch electrode columns and a second bridge pattern BR2 that electrically and/or physically connects adjacent second touch electrodes TE2.

Some of the touch sensing lines TSL may be connected to the first touch electrodes TE1, and the others of the touch sensing lines TSL may be connected to the second touch electrodes TE2. In an exemplary embodiment of the present disclosure, each of the first touch electrodes TE1 may be applied with a driving signal for touch sensing through a corresponding touch sensing line TSL, and each of the second touch electrodes TE2 may transfer a touch sensing signal through a corresponding touch sensing line TSL. However, the present disclosure is not limited thereto, and the opposite case is possible. In an exemplary embodiment of the present disclosure, each of the second touch electrodes TE2 may be applied with a driving signal for touch sensing through a corresponding touch sensing line TSL, and each of the first touch electrodes TE1 may transfer a touch sensing signal through a corresponding touch sensing line TSL.

In an exemplary embodiment of the present disclosure, the touch sensor TS may be configured to recognize a touch of a user by sensing a change in mutual capacitance formed between the first touch electrodes TE1 and the second touch electrodes TE2.

The touch sensor TS may include the first conductive pattern (see CP1 shown in FIG. 8) disposed on the base layer BSL, the first insulating layer IL1 disposed on the first conductive pattern CP1, the second conductive pattern (see CP2 shown in FIG. 8) disposed on the first insulating layer IL1, and the second insulating layer IL2 covering the second conductive pattern CP2.

The base layer BSL may be disposed on the thin film encapsulation layer TFE of the display panel DP. The base layer BSL may be configured with an organic insulating layer including an organic material or an inorganic insulating layer including an inorganic material. In an exemplary embodiment of the present disclosure, the base layer BSL may be made of a flexible material that is bendable or foldable. The base layer BSL may have a single- or multi-layered structure. In order to implement a touch screen function, the touch sensor TS may be coupled to the display panel DP that displays an image. Accordingly, the touch sensor TS may be transparent and capable of allowing light to be transmitted therethrough.

In some exemplary embodiments of the present disclosure, the base layer BSL may be an uppermost layer of the thin film encapsulation layer TFE of the display panel DP. For example, the base layer BSL may be an inorganic insulating layer (or inorganic layer) that is the uppermost layer of the thin film encapsulation layer TFE. In some exemplary embodiments of the present disclosure, the base layer BSL may be an inorganic insulating layer (or inorganic buffer layer) additionally disposed on the thin film encapsulation layer TFE. For example, the base layer BSL may be a silicon nitride layer, a silicon oxynitride layer, a silicon oxide layer, a titanium oxide layer, an aluminum oxide layer, or the like.

The first conductive pattern CP1 may be directly disposed on the base layer BSL. In some exemplary embodiments of the present disclosure, the first conductive pattern CP1 may overlap with the pixel defining layer (see PDL shown in FIG. 7).

The first conductive pattern CP1 may include the first touch electrodes TE1, the second touch electrodes TE2, and the first bridge pattern BR1.

The first conductive pattern CP1 may include a conductive material. The conductive material may include a transparent conductive oxide or a metallic material. Also, the first conductive pattern CP1 may include a plurality of stacked metal layers. Examples of the transparent conductive oxide may be indium tin oxide (ITO), indium zinc oxide (IZO), antimony zinc oxide (AZO), indium tin zinc oxide (ITZO), zinc oxide (ZnO), tin oxide ($SnO_2$), and the like. Examples of the metallic material may be copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like. The first conductive pattern CP1 may have a single- or multi-layered structure.

The first insulating layer IL1 may be provided and/or formed on the first conductive pattern CP1. For example, the first insulating layer IL1 may be provided and/or formed over the first and second touch electrodes TE1 and TE2 and the first bridge pattern BR1. The first insulating layer IL1 may include the same material as the base layer BSL, but the present disclosure is not limited thereto. In an exemplary embodiment of the present disclosure, the first insulating layer IL1 may be configured with an organic insulating layer including an organic material or an inorganic insulating layer including an inorganic material.

Like the first conductive pattern CP1, the second conductive pattern CP2 may include a single conductive material layer, or include a plurality of stacked conductive material layers. The second conductive pattern CP2 may include the second bridge pattern BR2 disposed on the first insulating layer IL1.

The second insulating layer IL2 may be disposed on the first insulating layer IL1 on which the second conductive pattern CP2 is provided. The second insulating layer IL2 may prevent corrosion of the second conductive pattern CP2 by preventing the second conductive pattern CP2 from being exposed to the outside. The second insulating layer IL2 may be configured with an organic insulating layer made of an organic material. The organic material may include acryl, polyimide (PI), polyamide (PA), and/or benzochclobutene (BCB). Since the second insulating layer IL2 configured as the organic insulating layer is transparent and flexible, the second insulating layer IL2 may reduce and planarize winding of a lower structure.

In an exemplary embodiment of the present disclosure, a case where the first bridge pattern BR1 and the first and second touch electrodes TE1 and TE2 are included in the first conductive pattern CP1, and the second bridge pattern BR2 is included in the second conductive pattern CP2 is described as an example, but the present disclosure is not limited thereto. In some exemplary embodiments of the present disclosure, as shown in FIG. 11B, the second bridge pattern BR2 may be included in the first conductive pattern CP1, and the first bridge pattern BR1 and the first and second touch electrodes TE1 and TE2 may be included in the second conductive pattern CP2. For example, the second bridge pattern BR2 may be formed and/or provided on the base layer BSL, and the first bridge pattern BR1 and the first and second touch electrodes TE1 and TE2 may be formed and/or provided on the first insulating layer IL1.

Also, in an exemplary embodiment of the present disclosure, a case where the first conductive pattern CP1 is disposed on the base layer BSL, and the second conductive pattern CP2 is disposed on the first insulating layer IL1 is described as an example, but the present disclosure is not limited thereto. In some exemplary embodiments of the present disclosure, the first conductive pattern CP1 may be disposed on the first insulating layer IL1, and the second conductive pattern CP2 may be disposed on the base layer BSL.

Also, in an exemplary embodiment of the present disclosure, a case where the first and second touch electrodes TE1 and TE2 are provided on the same layer is described as an example, but the present disclosure is not limited thereto. In some exemplary embodiments of the present disclosure, the first touch electrodes TE1 and the second touch electrodes TE2 may be provided as different layers.

In an exemplary embodiment of the present disclosure, each of the first touch electrodes TE1 and the second touch electrodes TE2 may have a mesh structure including a plurality of conductive fine lines. When the first touch electrodes TE1 and the second touch electrodes TE2 have the mesh structure, the overlapping area between the first touch electrodes TE1 and the second touch electrodes TE2 can be decreased. Accordingly, parasitic capacitance formed between electrodes of the display panel DP can be decreased.

Figure 12:
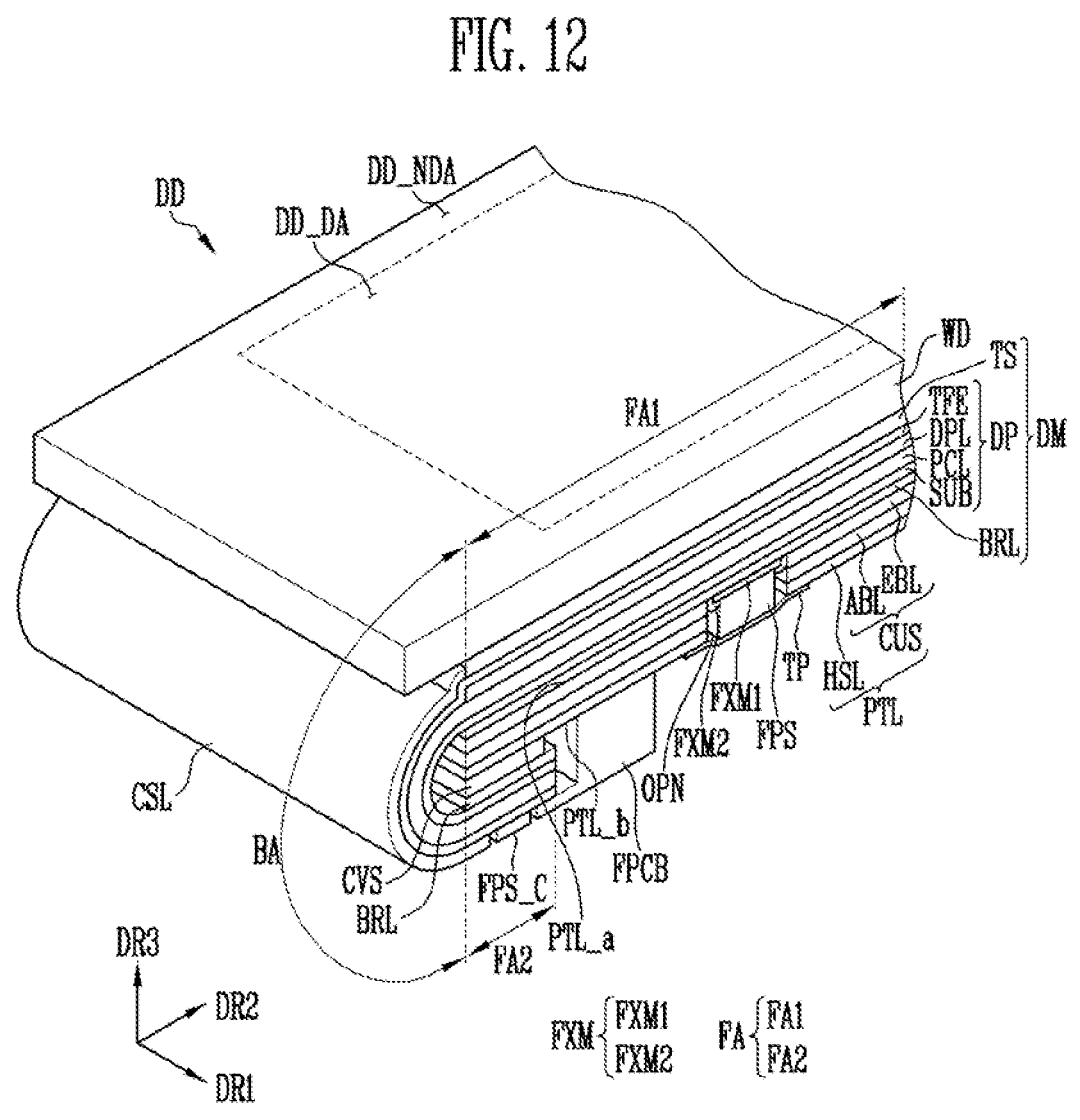
Figure 13:
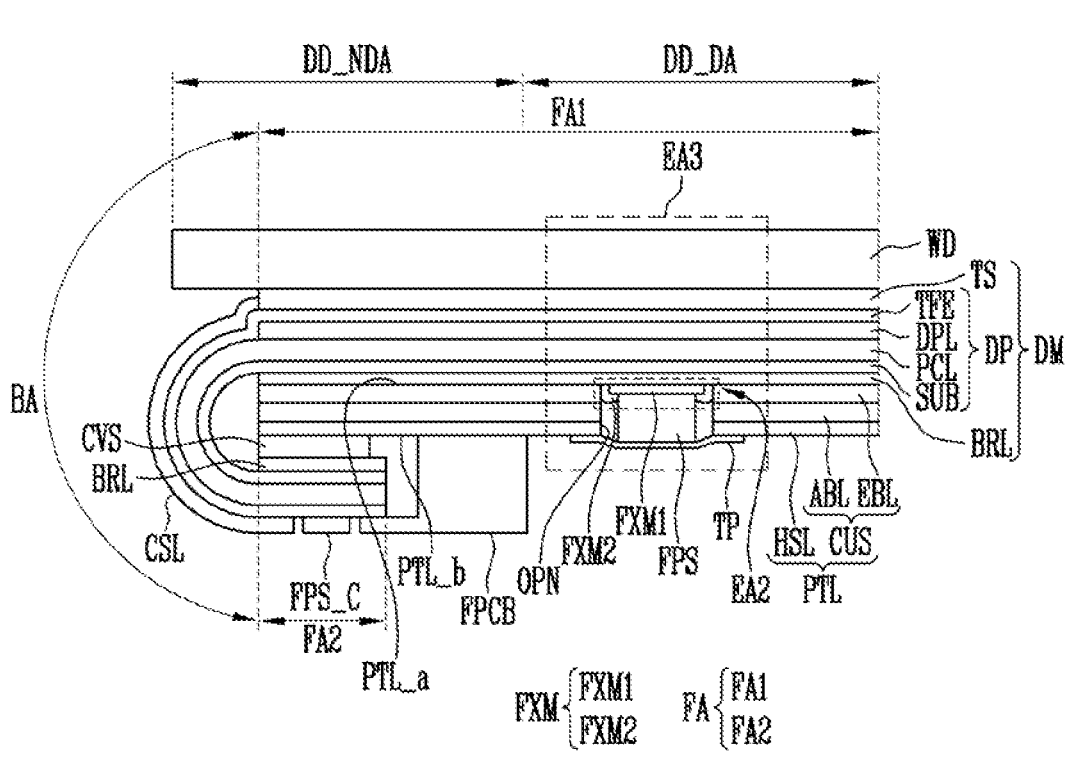
FIG. 13 is a cross-sectional view illustrating the display device shown in FIG. 12.
Figure 14:
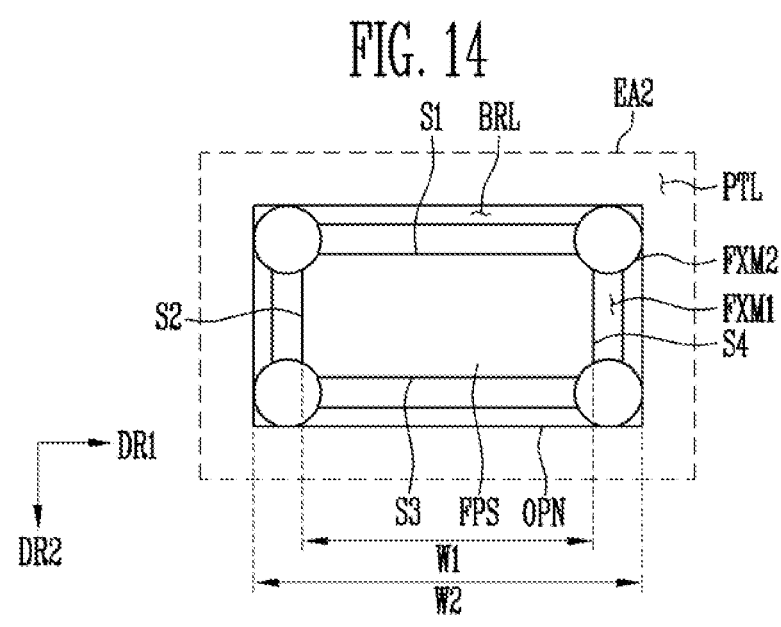
FIG. 14 is a plan view illustrating portion EA2 shown in FIG. 13.
Figures 15D, 15E, 15F:
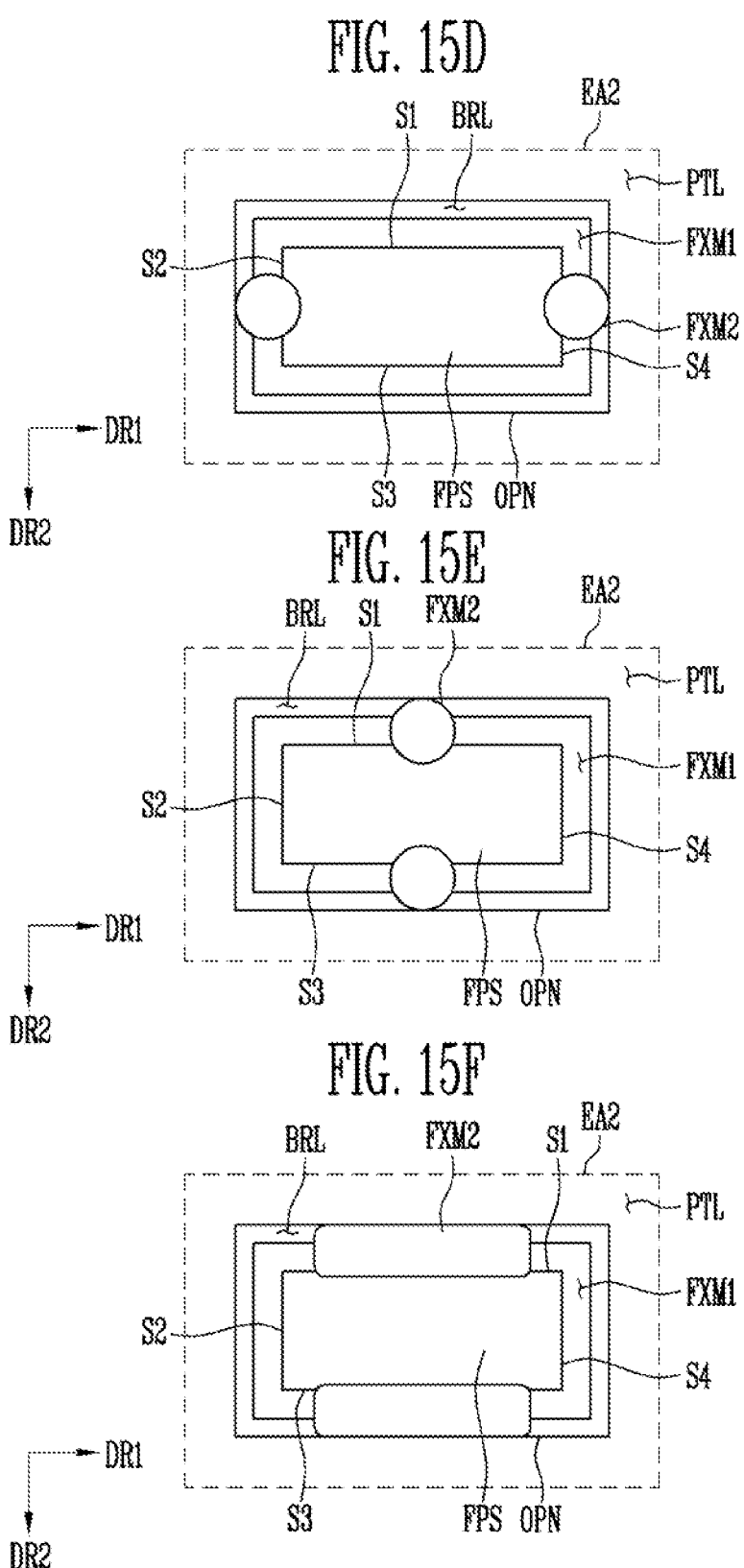
Figure 16:
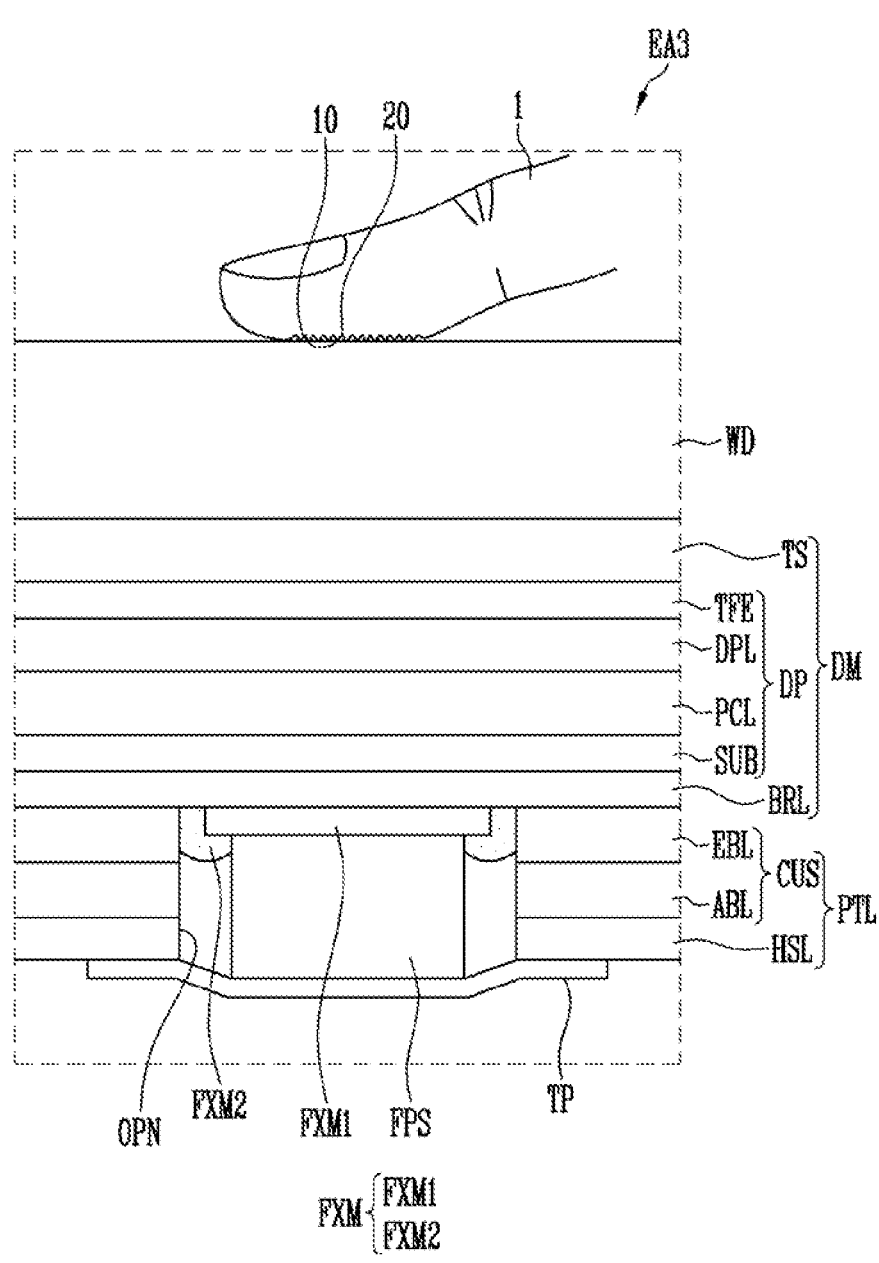
FIG. 16 is a diagram illustrating a fingerprint sensing method of the fingerprint sensor, which is an enlarged cross-sectional view illustrating portion EA3 shown in FIG. 13.

FIG. 12 is a perspective view illustrating in detail a portion of the display device shown in FIG. 2. FIG. 13 is a cross-sectional view illustrating the display device shown in FIG. 12. FIG. 14 is a plan view illustrating portion EA2 shown in FIG. 13. FIGS. 15A to 15F illustrate a second fixing member shown in FIG. 14, which are plan views corresponding to the portion EA2 shown in FIG. 13. FIG. 16 illustrating a fingerprint sensing method of the fingerprint sensor, which is an enlarged cross-sectional view illustrating portion EA3 shown in FIG. 13.

Referring to FIGS. 1 to 14, 15A to 15F, and 16, the display device DD, according to exemplary embodiments of the present disclosure, may include a display module DM, a window WD, and a fingerprint sensor FPS. In an exemplary embodiment of the present disclosure, the display module DM may include a display panel DP, a touch sensor TS, and a protective layer BRL.

The display device DD may include a display area DD_DA that displays an image and a non-display area DD_NDA in which the image is not displayed. Also, the display device DD may include a flat area FA and a bent area BA. The flat area FA and the bent area BA may be set with respect to the display panel DP. For example, the flat area FA and the bent area BA may be determined according to whether the display panel DP is bent.

The flat area FA may include a first flat area FA1 and a second flat area FA2, which are provided with the bent area BA interposed therebetween. The first flat area FA1 may correspond to the display area DD_DA and at least a portion of the non-display area DD_NDA. The bent area BA may correspond to the non-display area DD_NDA, and the second flat area FA2 may also correspond to the non-display area DD_NDA.

In an exemplary embodiment of the present disclosure, the window WD may be provided to correspond to the first flat area FA1 and a partial area of the bent area BA, the touch sensor TS and some components of the display panel DP may be provided to correspond to only the first flat area FA1, and the other components of the display panel DP may be provided to correspond to the bent area BA and the second flat area FA2 in addition to the first flat area FA1. However, the present invention is not limited to the above-described embodiments. In some exemplary embodiments of the present disclosure, all components of the window WD, the touch sensor TS, and the display panel DP may be provided to correspond to the first flat area FA1, the bent area BA, and the second flat area FA2.

The second flat area FA2 may face the first flat area FA1 with the bent area BA interposed therebetween in a state in which the display device DD is bent as shown in FIGS. 12 and 13.

The display panel DP may include a substrate SUB, a pixel circuit layer PCL disposed on the substrate SUB, a display element layer DPL disposed on the pixel circuit layer PCL, and a thin film encapsulation layer TFE covering the display element layer PCL. The substrate SUB, the pixel circuit layer PCL, and the thin film encapsulation layer TFE may be provided to correspond to the first flat area FA1, the bent area BA, and the second flat area FA2. The display element layer DPL may be provided to correspond to only the first flat area FA1. However, the present invention is not limited to the above-described embodiments. In some exemplary embodiments of the present disclosure, the thin film encapsulation layer TFE may be provided to correspond to only at least one area of the first flat area FA1 and the bent area BA continuous to the first flat area FA1. When the display panel DP is bent, the substrate SUB corresponding to the first flat area FA1 may face the substrate SUB corresponding to the second flat area FA2.

The display panel DP may further include a crack prevention layer CSL covering at least a portion of the thin film encapsulation layer TFE. The crack prevention layer CSL may be made of a polymer compound. The crack prevention layer CSL may minimize occurrence of a crack due to stress applied to the substrate SUB when the display panel DP is bent, and prevent propagation of the crack. Accordingly, the durability of the display module DM can be increased. The crack prevention layer CSL may correspond to the bent area BA, and be provided to correspond to at least a partial area of the second flat area FA2.

A flexible printed circuit board FPCB may be attached to one side of the display panel DP. Components such as the flexible printed circuit board FPCB, which have maximized space efficiency and are unnecessary to be viewed by a user, may face a lower surface of the display module DM, e.g., a surface on which the image is not displayed when the display panel DP is bent. Although a case where the flexible printed circuit board FPCB is attached onto the thin film encapsulation layer TFE is illustrated for convenience, the flexible printed circuit board FPCB may be attached to any one of the components included in the display panel DP such that the display panel DP is electrically connected to the driving circuit D-IC (see FIG. 5).

A fingerprint sensor driver FPS_C for driving the finger print sensor FPS may be disposed between the flexible printed circuit board FPCB and the crack prevention layer CSL. Although a case where the fingerprint sensor driver FPS_C is disposed separately from the flexible printed circuit board FPCB on the display panel DP is illustrated, the present disclosure is not limited thereto. In some exemplary embodiments of the present disclosure, the fingerprint sensor driver FPS_C may be mounted on the flexible printed circuit board FPCB.

The protective layer BRL may be disposed on a lower surface of the display panel DP, e.g., a lower surface of the substrate SUB. An adhesive (or gluing agent) may be included between the protective layer BRL and the lower surface of the display panel DP. Thus, the protective layer BRL and the display panel DP can be more firmly coupled (or attached) to each other by the adhesive. The protective layer BRL may be provided to correspond to the first flat area FA1 and the second flat area FA2. Hereinafter, for convenience, the protective layer BRL corresponding to the first flat area FA1 is referred to as a first protective layer BRL, and the protective layer BRL corresponding to the second flat area FA2 is referred to as a second protective layer BRL.

The first protective layer BRL and the second protective layer BRL may be separated from each other with the bent area BA interposed therebetween. The first protective layer BRL and the second protective layer BRL may face each other when the display panel DP is bent. In an exemplary embodiment of the present disclosure, the protective layer BRL might not be provided in the bent area BA so as to minimize stress generated when the display panel DP is bent, but the present disclosure is not limited thereto. In some exemplary embodiments of the present disclosure, the protective layer BRL may be provided in the bent area BA.

A cover panel PTL may be formed and/or provided on a back surface (or lower surface) of the protective layer BRL. The back surface (or lower surface) of the protective layer BRL may mean a surface on which the display panel DP is not provided. An adhesive layer (or gluing layer) may be included between the protective layer BRL and the cover panel PTL. Thus, the protective layer BRL and the cover panel PTL can be more firmly coupled (or attached) to each other by the adhesive layer.

The cover panel PTL may be provided on a back surface of the display module DM, i.e., a surface on which the image is not displayed. The cover panel PTL may be configured to protect the protective layer BRL from external impact, etc. The cover panel PTL may include a heat dissipation layer HSL and a cushion layer CUS, which are sequentially stacked.

The heat dissipation layer HSL dissipates heat generated from heating members disposed adjacent thereto. Accordingly, the heat dissipation layer HSL can easily dissipate heat generated in a driving process of the heating members disposed adjacent thereto, and thus the heating members can be stably driven even when a driving time of the heating members elapses. The heating members may include the pixel circuit layer PCL, the display element layer DPL, the touch sensor TS, and the like. However, the present disclosure is not limited thereto, and all components the generate heat in a driving process thereof may be included in the heating members.

In an exemplary embodiment of the present disclosure, the flexible printed circuit board FPCB may be connected to the heat dissipation layer HSL while facing the lower surface of the display module DM when the display panel DP is bent. Accordingly, heat generated in the flexible printed circuit board FPCB is easily dissipated through the heat dissipation layer HSL, so that the flexible printed circuit board FPCB can be stably driven.

The heat dissipation layer HSL may include a material having high thermal conductivity. The heat dissipation layer HSL may have a higher heat dissipation property when the thermal conductivity of the heat dissipation layer HSL becomes higher. For example, the heat dissipation layer HSL may include an organic material having high thermal conductivity, such as carbon (graphite), or a metal. The heat dissipation layer HSL may include a plurality of through holes so as to have a high heat dissipation property.

The cushion layer CUS may include a material that functions to reduce external impact and is elastically deformable. For example, the cushion layer CUS may include thermoplastic elastomer, polystyrene, polyolefin, polyurethane thermoplastic elastomers, polyamides, synthetic rubbers, polydimethylsiloxane, polybutadiene, polyisobutylene, poly(styrene-butadienestyrene, polyurethanes, polychloroprene, polyethylene, silicone, or a combination thereof, However, the present disclosure is not limited to the above-described examples, and a suitable material may be selected within the range having no influence on image display of the display panel DP among materials having elasticity.

The cushion layer CUS may be provided as a single layer. However, the present disclosure is not limited thereto, and the cushion layer CUS may be provided as a multi-layer in which a plurality of separated layers are stacked. When the cushion layer CUS is provided as the multi-layer, the cushion layer CUS may include an absorbing layer ABL and an embossed layer EBL, which are sequentially stacked from the heat dissipation layer HSL.

The embossed layer EBL may include a plurality of embossed patterns that reduce and disperse external impact, etc., and may be provided as a single layer and/or a multi-layer. The absorbing layer ABL may have air filled therein or have a dispersible material or sound absorbing material filled therein to absorb external impact, etc., and may be provided as a single layer and/or a multi-layer. The embossed layer EBL and the absorbing layer ABL may be formed in a form in which they are separated from each other as shown in the drawings to be coupled to each other by a gluing agent, an adhesive, or the like, but the present disclosure is not limited thereto. In some exemplary embodiments of the present disclosure, the embossed layer EBL and the absorbing layer ABL may be integrally provided.

An adhesive (or gluing agent) may be included between the cushion layer CUS and the heat dissipation layer HSL. The cushion layer CUS and the heat dissipation layer HSL may be coupled (or attached) to each other by the adhesive.

The first protective layer BRL may be provided and/or formed on an upper surface PTL_a of the cover panel PTL, and the second protective layer BRL may be provided and/or formed on a lower surface (or back surface) PTL_b of the cover panel PTL with a cover spacer CVS interposed therebetween.

The cover spacer CVS may control a bending (or curving) degree of the display panel DP by constantly maintaining between the cover panel PTL and the display panel DP corresponding to the second flat area FA2 when the display panel DP is bent. Also, the cover spacer CVS may support some components of the display panel DP, which correspond to the second flat area FA2, when the first flat area FA1 and the second flat area FA2 face each other when the display panel DP is bent. In an exemplary embodiment of the present disclosure, the cover spacer CVS may include the same material as the cushion layer CUS. However, the present disclosure is not limited thereto, and the cover spacer CVS may include a material suitable for a design condition of the display panel DP, etc. among materials having elasticity.

Meanwhile, the cover panel PTL may include an opening OPN that exposes a portion of the back surface (or lower surface) of the protective layer BRL. The opening OPN of the cover panel PTL may be provided to penetrate the cover panel PTL. The opening OPN of the cover panel PTL may be provided and/or formed at a position corresponding to the display area DD_DA of the display device DD. In some exemplary embodiments of the present disclosure, the opening OPN of the cover panel PTL may be provided and/or formed at a position corresponding to the non-display area DD_NDA of the display device DD.

The fingerprint sensor FPS may be inserted into the opening OPN of the cover panel PTL. A width W2 of the opening OPN of the cover panel PTL in at least one direction may be equal to or larger than that W1 of the fingerprint sensor FPS in at least one direction. The at least one direction of the opening OPN of the cover panel PTL may mean a lateral direction and/or a longitudinal direction of the fingerprint sensor FPS.

In an exemplary embodiment of the present disclosure, the fingerprint sensor FPS may be an ultrasonic sensing type sensor that detects a fingerprint of a user, using ultrasonic waves. For example, the fingerprint sensor FPS may detect a fingerprint of a finger 1 of a user by transmitting an ultrasonic signal toward the display module DM and analyzing intensities of the ultrasonic signals reflected from ridges 10 and valleys 20 of the fingerprint of the finger 1 of the user.

To this end, the fingerprint sensor FPS may include a plurality of piezoelectric sensors that are disposed densely and a polymer disposed between the plurality of piezoelectric sensors to insulate vibrations between the respective piezoelectric sensors. The piezoelectric sensors are electrically connected to the fingerprint sensor driver FPS_C, and the fingerprint sensor driver FPS_C applies an AC voltage having a predetermined frequency to each piezoelectric sensor. An ultrasonic signal having a predetermined resonant frequency may be radiated to the outside while the piezoelectric sensor is being vibrated by the AC voltage.

When any object is not in contact with one surface (or contact surface) of the window WD, a majority of ultrasonic signals do not pass through the one surface (or contact surface) of the window WD but is reflected and returned due to a medium difference between the one surface (or contact surface) of the window WD and air. On the other hand, when the finger 1 of the user is in contact with the one surface (or contact surface) of the window WD, some of the ultrasonic signals in direct contact with the valleys 20 of the fingerprint pass through an interface between the one surface (or contact surface) of the window WD and the fingerprint, and only some of the ultrasonic signals generated by the piezoelectric sensor are reflected and returned. The fingerprint sensor driver FPS_C may sense the fingerprint of the finger 1 of the user by measuring intensities of the reflected and returned ultrasonic signals.

The fingerprint sensor FPS may be attached to the display module DM, e.g., the protective layer BRL in the opening OPN of the cover panel PTL, using a fixing member FXM. When the fingerprint sensor FPS is inserted into the opening OPN of the cover panel PTL, the distance between the fingerprint of the finger 1 of the user and the finger print sensor FPS is decreased, so that ultrasonic receiving efficiency can be increased.

The fingerprint sensor FPS is inserted (or buried) into the opening OPN of the cover panel PTL without changing the structure of the display module DM, to be disposed on the bottom of the display module DM. Thus, the fingerprint sensor FPS can sense the fingerprint of the finger 1 of the user without having to be influences by the size of a bezel of the display module DM.

In an exemplary embodiment of the present disclosure, a case where only one fingerprint sensor FPS is inserted into the opening OPN of the cover panel PTL is described, but the present disclosure is not limited thereto. In some exemplary embodiments of the present disclosure, at least one fingerprint sensor FPS may be inserted into the opening OPN of the cover panel PTL. The fingerprint of the finger 1 of the user may be detected by synthesizing images acquired from at least one fingerprint sensor FPS.

The fixing member FXM may be located in the opening OPN of the cover panel PTL, and may stably fix and/or attach the fingerprint sensor FPS to the display module DM. The fixing member FXM may include a first fixing member FXM1 and a second fixing member FXM2.

The first fixing member FXM1 may be provided and/or formed between the fingerprint sensor FPS and the back surface (or lower surface) of the protective layer BRL. The first fixing member FXM1 is disposed on an upper surface of the fingerprint sensor FPS to attach the fingerprint sensor FPS to the back surface (or lower surface) of the protective layer BRL when the fingerprint sensor FPS is inserted into the opening OPN of the cover panel PTL. The first fixing member FXM1 may include a thermosetting resin that has adhesion by allowing a chemical reaction to be caused by heat. For example, the thermosetting resin may include an epoxy resin, an amino resin, a phenol resin, a polyester resin, and the like, which are made of an organic material.

The first fixing member FXM1 may be made of a curable resin composition including a thermal polymerization initiator that initiates a curing reaction, using heat. In an exemplary embodiment of the present disclosure, the type of the thermal polymerization initiator is not particularly limited, but may include a mixture of one or two types of azo compounds such as 2,2'-azobis(2-methylbutyronitrile), 2,2'-azobis(isobutyronitrile), 2,2'-azobis(2,4-dimethylvaleronitrile), 4,4-azobis(4-cyanovaleric acid), 1,1'-azobis(cyclohexane carbonitrile) and 2,2'-azobis(4-methoxy-2,4-dimethyl valeronitrile); peroxide compounds such as tetramethylbutylperoxy neo-decanoate (e.g., Perocta ND, NOF), bis(4-butycyclohexyl)peroxydicarbonate (e.g., Peroyl TCP, NOF), di-(2-ethylhexyl)peroxy carbonate, butylperoxy neo-decanoate (e.g., Perbutyl ND, NOF), di-n-propyl peroxydicarbonate (e.g., Peroyl NPP, NOF), di-isopropyl peroxy dicarbonate (e.g., Peroyl IPP, NOF), diethoxyethyl peroxydicarbonate (e.g., Peroyl EEP, NOF), diethoxylhexyl peroxydicarbonate (e.g., Peroyl OEP, NOF), hexyl peroxydicarbonate (e.g., Perhexyl ND, NOF), dimethoxybutyl peroxydicarbonate (e.g., Peroyl MBP, NOF), bis(3-metoxy-3-metoxybutyl) peroxydicarbonate (e.g., Peroyl SOP, NOF), dibutyl peroxy dicarbonate, diacetyl peroxydicarbonate, dimyristyl peroxydicarbonate, 1,1,3,3-tetramethylbutyl peroxypivalate, hexyl peroxypivalate (e.g., Perhexyl PV, NOF), butyl peroxypivalate (e.g., Perbutyl, NOF), 3,5,5-trimethyl-hexanol peroxide (e.g., Peroyl 355, NOF), 1,1-dimethyl-3-hydroxybutyl peroxy-neodecanoate (e.g., Luperox 610M75, Altofina), t-amyl peroxy-neodecanoate (e.g., Luperox 546M75, Atofina), t-butyl peroxy-neodecanoate (e.g., Luperox 10M75, Atofina), t-butyl peroxy-neoheptanoate, t-butyl peroxy-pivalate, t-amyl peroxy-2-ethyl hexanoate, lauroyl peroxide, dilauroyl peroxide, didecanoyl peroxide, benzoyl peroxide, dibenzoyl peroxide, 2,2-bis(tert-butylperoxy)butane, 1,1-bis(tert-butyl peroxy)cyclohexane, 2,5-bis(tert-butylperoxy)-1-methylethyl)benzene, 1,1-bis(tert-butylperoxy)-3,3,5-trimethylcyclohexane, tert-butyl hydroperoxide, tert-butyl peroxide, tert-butyl peroxybenzoate, tert-butylperoxy isopropyl carbonate, cumene hydroperoxide, dicumyl peroxide, lauroyl peroxide and 2,4-pentanedione peroxide; tert-butyl peracetate; peracetic acid; or potassium persulfate. However, the present disclosure is not limited thereto.

The second fixing member FXM2 may be provided and/or formed on one side surface of the first fixing member FXM1, one side surface of the fingerprint sensor FPS, and the back surface (or lower surface) of the protective layer BRL. The second fixing member FXM2 along with the first fixing member FXM1 may fix and/or attach the fingerprint sensor FPS to the back surface of the protective layer BRL. For example, in an exemplary embodiment of the present disclosure, the second fixing member FXM2 may be made of a material different from that of the first fixing member FXM1. For example, the second fixing member FXM2 may be made of a photo-curable resin including a photo-polymerization initiator that is bridged and cured by light such as UV light.

In an exemplary embodiment of the present disclosure, the type of the photo-polymerization initiator is not particularly limited, but may include α-hydroxy ketone compound (e.g., IRGACURE 184, IRGACURE500, IRGACURE 2959, DAROCUR 1173, Ciba Specialty Chemicals), phenyl glyoxylate compound (e.g., IRGACURE 754, DAROCUR MBF, Ciba Specialty Chemicals), benzyldimethyl-ketal compound (e.g., IRGACURE 651, Ciba Specialty Chemicals), α-amino ketone compound (e.g., IRGACURE 369, IRGACURE 907, IRGACURE 1300, Ciba Specialty Chemicals), mono acyl phosphine compound (MAPO) (e.g., DAROCUR TPO, Ciba Specialty Chemicals), bisacyl phosphine compound (BAPO) (e.g., IRGACURE 819, IRGACURE 819DW, Ciba Specialty Chemicals), phosphine oxide compound (e.g., IRGACURE 2100, Ciba Specialty Chemicals), metallocene compound (e.g., IRGACURE 784, Ciba Specialty Chemicals), iodonium salt (e.g., IRGACURE 250, Ciba Specialty Chemicals), or at least any one compound thereof (e.g., DAROCUR 4265, IRGACURE 2022, IRGACURE 1300, IRGACURE 2005, IRGACURE 2010, IRGA- CURE 2020, Ciba Specialty Chemicals). However, the present disclosure is not limited thereto.

When the fingerprint sensor FPS having the first fixing member FXM1 applied to an upper surface thereof is fixed and/or attached to the back surface (or lower surface) of the protective layer BRL by being inserted into the opening OPN of the cover panel PTL, the second fixing member FXM2 may be provided to fill an empty space between the fingerprint sensor FPS and the opening OPN of the cover panel PTL, and be instantaneously cured by exposure to light such as UV light.

As shown in FIG. 14, the second fixing member FXM2 may be applied in a dot shape to overlap with at least a portion of the back surface (or lower surface) of the protective layer BRL while overlapping with each corner of the fingerprint sensor FPS configured with four sides S1 to S4. Also, the second fixing member FXM2 may overlap with at least a portion of the first fixing member FXM1 corresponding to each corner of the fingerprint sensor FPS. Since the second fixing member FXM2 is provided in at least a portion of an edge of the fingerprint sensor FPS, e.g., each corner of the fingerprint sensor FPS, the second fixing member FXM2 can stably fix and/or attach the fingerprint sensor FPS to the back surface (or lower surface) of the protective layer BRL while having no influence on an ultrasonic signal advancing to the fingerprint sensor FPS.

In the above-described embodiment, a case where the second fixing member FXM2 is provided to correspond to each corner of the fingerprint sensor FPS is described, but the present disclosure is not limited thereto. In some exemplary embodiments of the present disclosure, the second fixing member FXM2 may be provided to correspond to at least one corner among the four corners of the fingerprint sensor FPS. In an exemplary embodiment of the present disclosure, in order to stably fix the fingerprint sensor FPS without being twisted, it may be appropriate that the second fixing member FXM2 is provided to correspond to at least two corners of the fingerprint sensor FPS as shown in FIGS. 15A to 15C. However, the present disclosure is not necessarily limited thereto.

Also, the second fixing member FXM2 may be provided to correspond to each corner of the fingerprint sensor FPS. However, as shown in FIGS. 15D, the second fixing member FXM may be provided to correspond to at least a portion of each of a pair of short sides S2 and S4 facing each other among the four sides S1 to S4 constituting the fingerprint sensor FPS. In some exemplary embodiments of the present disclosure, as shown in FIG. 15E, the second fixing member FXM2 may be provided to correspond to at least a portion of each of a pair of long sides S1 and S3 facing each other among the four sides S1 to S4 constituting the fingerprint sensor FPS.

In an exemplary embodiment of the present disclosure, the second fixing member FXM2 may be applied in a dot shape to overlap with at least a portion of the fingerprint sensor FPS, but the present disclosure is not limited thereto. In some exemplary embodiments of the present disclosure, the second fixing member FXM2 may be applied in various shapes, e.g., a linear shape covering at least a portion of each of the pair of long sides S1 and S3 facing each other among the four sides S1 to S4 of the fingerprint sensor FPS as shown in FIG. 15F, within the range where it is not viewed to the outside.

Additionally, although a case where the second fixing member FXM2 is provided to fill an empty space between the opening OPN of the cover panel PTL and the side surface of the fingerprint sensor FPS is described in FIGS. 12, 13, and 16, the present disclosure is not limited thereto. In an exemplary embodiment of the present disclosure, the second fixing member FXM2 may be provided to entirely fill the empty space between the opening OPN of the cover panel PTL and the side surface of the fingerprint sensor FPS. Alternatively, another fixing member separate from the first and second fixing members FXM1 and FXM2 may be provided to entirely fill the empty space between the opening OPN of the cover panel PTL and the side surface of the fingerprint sensor FPS.

As described above, when the second fixing member FXM2 is made of a photo-curable resin, the second fixing member FXM2 may instantaneously provide adhesion between the fingerprint sensor FPS and the back surface (or lower surface) of the protective layer BRL. The second fixing member FXM2 may stably fix and/or attach the fingerprint sensor FPS to the back surface (or lower surface) of the protective layer BRL while complementing the adhesion of the first fixing member FXM1 made of the thermo-setting resin.

For example, when the fingerprint sensor FPS is attached and/or fixed to the back surface (or lower surface) of the protective layer BRL, using only the first fixing member FXM1 including an organic material such as epoxy resin, the first fixing member FXM1 might not be well permeated between the fingerprint sensor FPS and the back surface (or lower surface) of the protective layer BRL. Accordingly, the adhesion between the fingerprint sensor FPS and the back surface (or lower surface) of the protective layer BRL may be lowered, and the fingerprint sensor FPS may be twisted at a fixed position due to a long curing time of the first fixing member FXM1. Therefore, an operating failure that the fingerprint sensor FPS does not appropriately transmits and receives an ultrasonic signal may occur, and finally, the fingerprint of the finger 1 of the user might not be appropriately recognized.

According to an exemplary embodiment of the present disclosure, the adhesion is instantaneously provided between the fingerprint sensor FPS and the back surface (or lower surface) of the protective layer BRL by applying the second fixing member FXM2 made of the photo-curable resin between the fingerprint sensor FPS and the back surface (or lower surface) of the protective layer BRL, so that the movement of the fingerprint sensor FPS can be minimized before the first fixing member FXM1 is cured. Accordingly, the fingerprint sensor FPS can be prevented in advance from being moved at the fixed position. As a result, the fingerprint sensor FPS can be fixed and/or attached to the back surface (or lower surface) of the protective layer BRL through the second fixing member FXM2 before the first fixing member FXM1 is completely cured. In addition, the fingerprint sensor FPS can be more stably fixed and/or fixed to the back surface (or lower surface) of the protective layer BRL after the first fixing member FXM1 is cured.

A light shielding tape TP may be disposed on a back surface of the fingerprint sensor FPS, e.g., a surface onto which the first fixing member FXM1 is not applied. The light shielding tape TP may prevent the fingerprint sensor FPS from being viewed by the user on an upper surface of the display module DM. Also, the light shielding tape TP may be attached to the lower surface PTL_b of the cover panel PTL, to more stably fix the fingerprint sensor FPS. The light shielding tape TP may be configured with a black fixing tape for preventing external light from being introduced into the display module DP through the opening OPN of the cover panel PTL.

Figure 17:
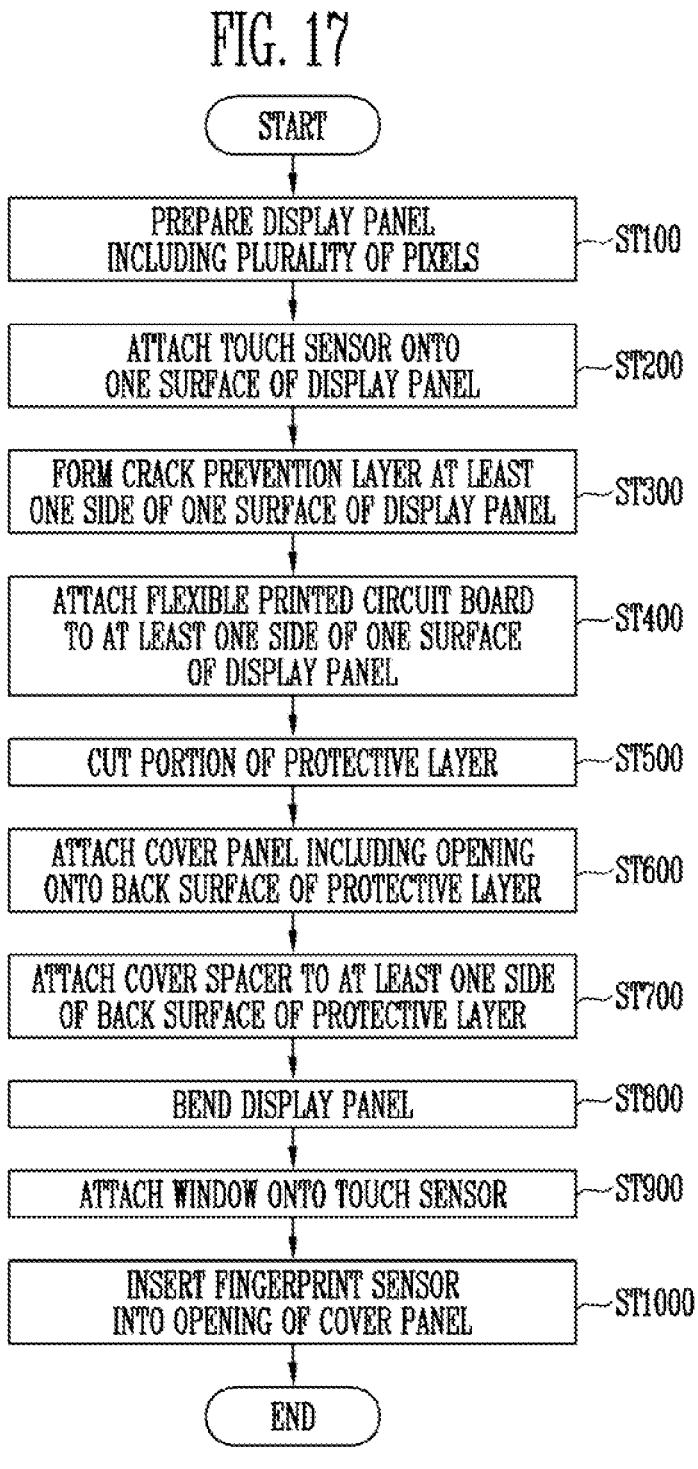
FIG. 17 is a flowchart illustrating a method of combining the display panel, the touch sensor, a window, and the fingerprint sensor, which are shown in FIGS. 12 and 13.
Figure 18H:
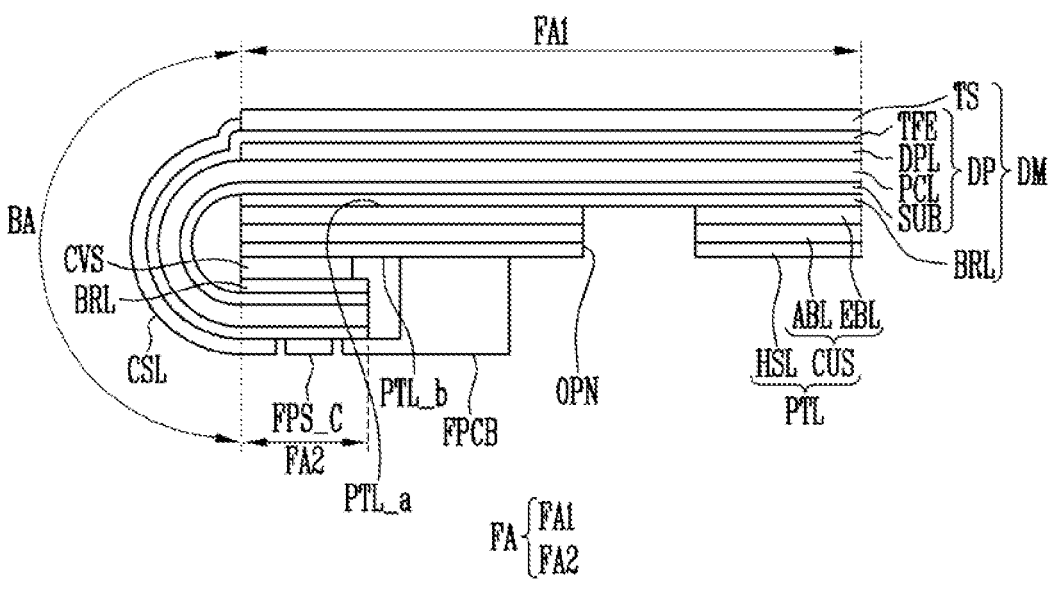
Figure 18I:
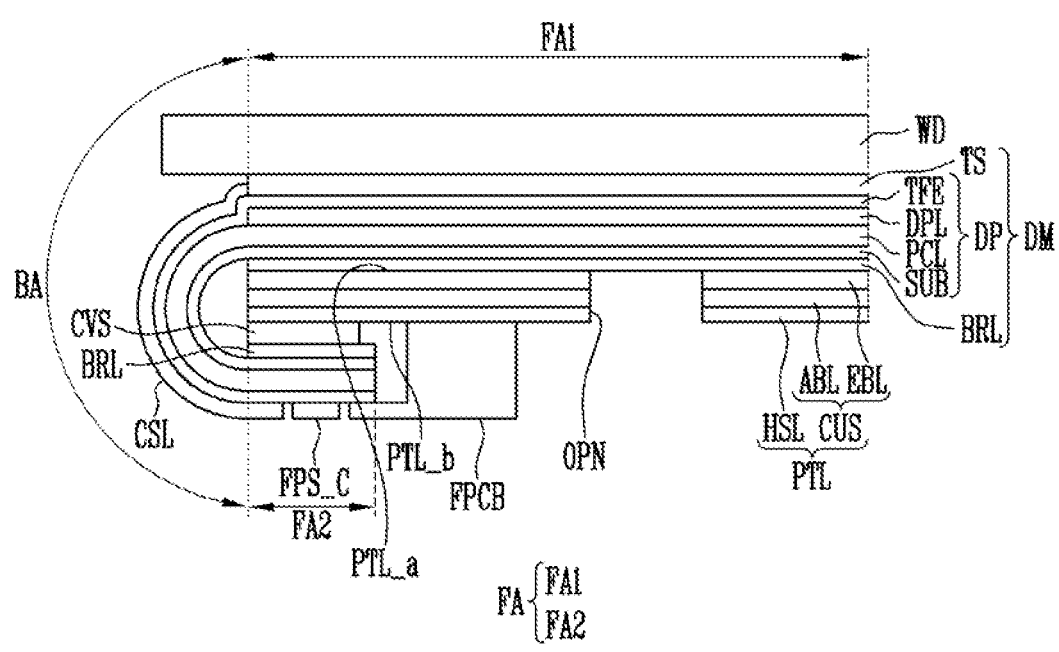
Figure 18J:
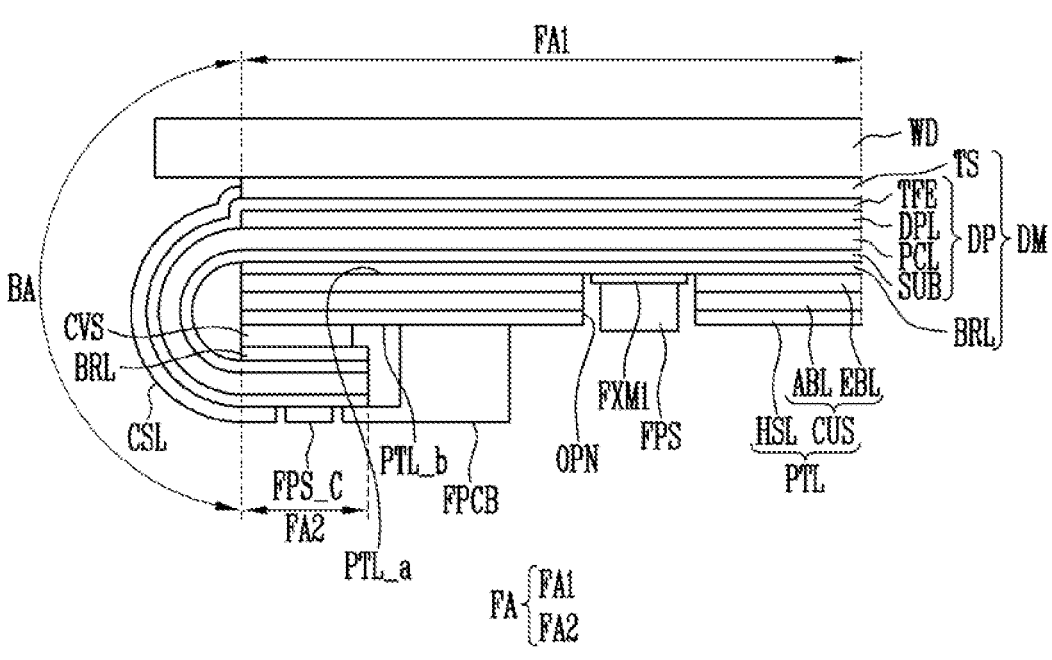
Figure 18K:
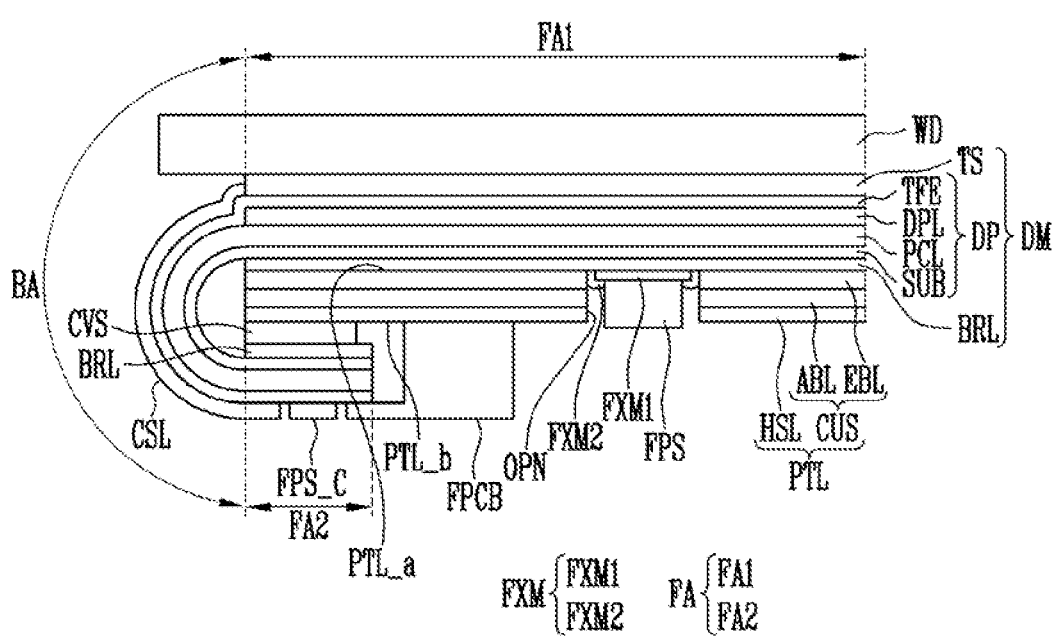
Figure 18L:
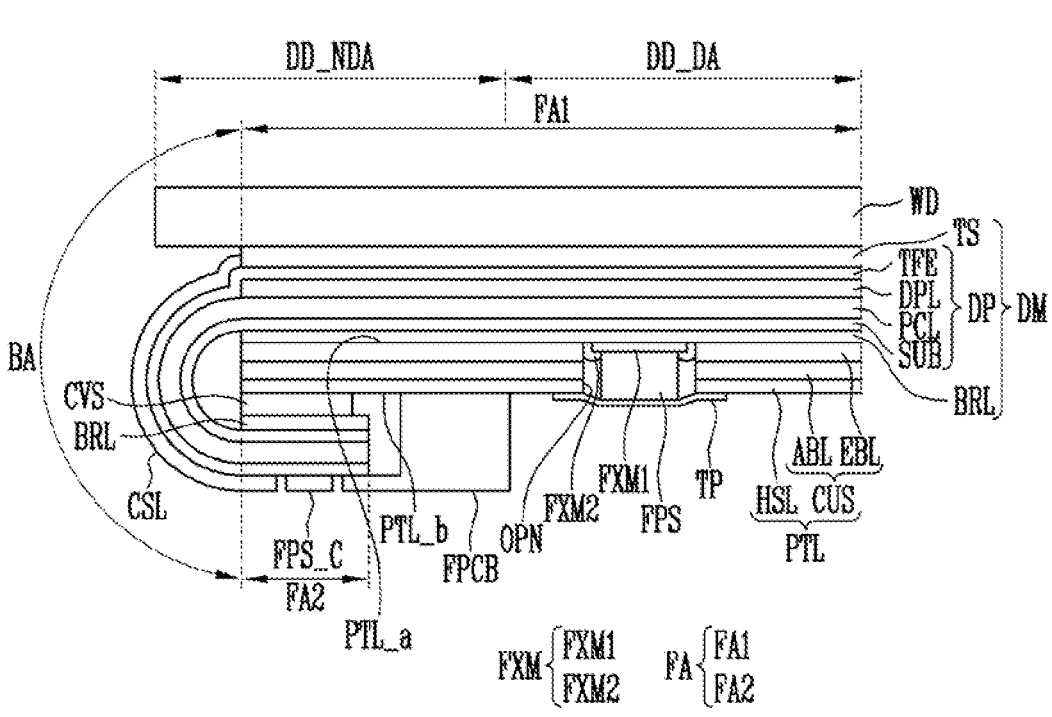

FIG. 17 is a flowchart illustrating a method of combining the display panel, the touch sensor, the window, and the fingerprint sensor, which are shown in FIGS. 12 and 13. FIGS. 18A to 18L are cross-sectional views sequentially illustrating the method of combining the display panel, the touch sensor, the window, and the fingerprint sensor, which are shown in FIGS. 12 and 13, according to the flowchart shown in FIG. 17.

Hereinafter, the method of combining the display panel, the touch sensor, the window, and the fingerprint sensor, according to an exemplary embodiment of the present disclosure, will be schematically described in conjunction with the embodiments described in FIGS. 1 to 14 and FIGS. 17 and 18A to 18L.

Referring to FIGS. 12, 13, 17, and 18A, first, a display panel DP including a plurality pixels is prepared (ST100).

The display panel DP may include a substrate SUB, a pixel circuit layer PCL, a display element layer DPL, and a thin film encapsulation layer TFE. A protective layer BRL may be formed on one surface of the substrate SUB, e.g., the other surface opposite to a surface on which the pixel circuit layer PCL and the like are provided and/or formed.

The display panel DP and the protective layer BRL may include a flat area FA that is not folded/bent but remains flat.

Referring to FIGS. 12, 13, 17, and 18B, a touch sensor TS is attached on one surface of the display panel DP (ST200).

The touch sensor TS may be formed on the thin film encapsulation layer TFE of the display panel DP. The touch sensor TS may be provided on the thin film encapsulation layer TFE to correspond to a display area DD_DA of the display device DD. Accordingly, at least a partial area of the thin film encapsulation layer TFE may be exposed.

Referring to FIGS. 12, 13, 17, and 18C, a crack prevention layer CSL is formed in at least one side of the one surface of the display panel DP (ST300).

For example, the crack prevention layer CSL may be formed on the thin film encapsulation layer TFE to correspond to the thin film encapsulation layer exposed to the outside on the one surface of the display panel DP. In an exemplary embodiment of the present disclosure, the crack prevention layer CSL may be formed on the exposed thin film encapsulation layer TFE to correspond to only a bent area BA when the display panel DP is bent through a process which will be described later. Accordingly, a portion of the thin film encapsulation layer TFE is not covered by the crack prevention layer CSL but may be exposed.

Referring to FIGS. 12, 13, 17, and 18D, a flexible printed circuit board FPCB is attached to at least one side of the one surface of the display panel DP (ST400).

For example, the flexible printed circuit board FPCB may be attached onto the thin film encapsulation layer TFE that is not covered by the crack prevention layer CSL. In an exemplary embodiment of the present disclosure, the flexible printed circuit board FPCB may be directly attached onto the pixel circuit layer PCL of the display panel DP. In an exemplary embodiment of the present disclosure, the flexible printed circuit board FPCB may be directly attached onto the substrate SUB of the display panel DP.

The flexible printed circuit board FPCB may be attached to at least one side of any one of the components included in the display panel DP to face a surface of the display panel DP, on which an image is not displayed when the display panel DP is bent.

Additionally, a fingerprint sensor driver FPS_C may be mounted between the crack prevention layer CSL and the flexible printed circuit board FPCB on the thin film encapsulation layer TFE.

Referring to FIGS. 12, 13, 17, and 18E, a portion of the protective layer BRL is removed through a cutting process (ST500).

For example, a portion of the protective layer BRL may be removed so as to minimize stress generated when the display panel is bent through the process which will be described later. The removed portion of the protective layer BRL may correspond to the bent area BA of the display module DM.

Referring to FIGS. 12, 13, 17, and 18F, a cover panel PTL including an opening OPN is attached onto a back surface (or lower surface) of the protective layer BRP (ST600).

The cover panel PTL may include a heat dissipation layer HSL and a cushion layer CUS formed on the heat dissipation layer HSL. The cover panel PTL may be attached onto only a partial area of the protective layer BRL. For example, the cover panel PTL may be attached onto the back surface (or lower surface) of the protective layer BRL, which does not face a lower surface (or back surface) PTL_b of the cover panel PTL while maintaining a flat shape when the display panel DP is bent through the process which will be described later.

Referring to FIGS. 12, 13, 17, and 18G, a cover spacer CVS is attached onto the back surface (or lower surface) of the protective layer BRL (ST700).

The cover spacer CVS may be attached onto only a partial area of the protective layer BRL. For example, the cover spacer CVS may be attached onto the back surface (or lower surface) of the protective layer BRL, which faces the lower surface (or back surface) PTL_b of the cover panel PTL while maintaining the flat shape when the display panel DP is bent through the process which will be described later.

Referring to FIGS. 12, 13, 17, and 18H, at least a portion of the display panel DP is bent along a folding line (ST800).

Accordingly, the display panel DP may include the bent area BA and first and second flat areas FA1 and FA2 provided with the bent area BA interposed therebetween. The cover panel PTL and the protective layer BRL corresponding to the second flat area FA2 may face each other with the cover spacer CVS interposed therebetween. In addition, the flexible printed circuit board FPCB may be in direct contact with the lower surface PTL_B of the cover panel PTL, particularly, the heat dissipation layer HSL.

Referring to FIGS. 12, 13, 17, and 18I, a window WD is attached onto the top of the touch sensor TS (ST900).

The window WD may correspond to the first flat area FA1, and cover components located in the bent area BA, e.g. the crack prevention layer CSL, a portion of the thin film encapsulation layer TFE, and the like, to prevent the components from being viewed by a user.

Referring to FIGS. 12, 13, 17, and 18J to 18L, a fingerprint sensor FPS is inserted into the opening OPN of the cover panel PTL (ST1000).

A first fixing member FXM1 may be applied onto an upper surface of the fingerprint sensor FPS, and the fingerprint sensor FPS may be inserted into the opening OPN of the cover panel PTL in a state in which the first fixing member FXM1 is applied. Subsequently, the first fixing member FXM1 is cured by applying heat to the first fixing member FXM1 such that the fingerprint sensor FPS is fixed to the protective layer BRL.

Subsequently, a second fixing member FXM2 is instantaneously cured by applying the second fixing member FXM2 into the fingerprint sensor FPS and the opening OPN of the cover panel PTL and then directing UV light onto the second fixing member FXM2.

Additionally, a light shielding tape TP is continuously attached onto a lower surface of the fingerprint sensor FPS and the lower surface PTL_b of the cover panel PTL, so that the fingerprint sensor FPS can be more firmly fixed while preventing separation of the fingerprint sensor FPS.

Figures 19, 20:
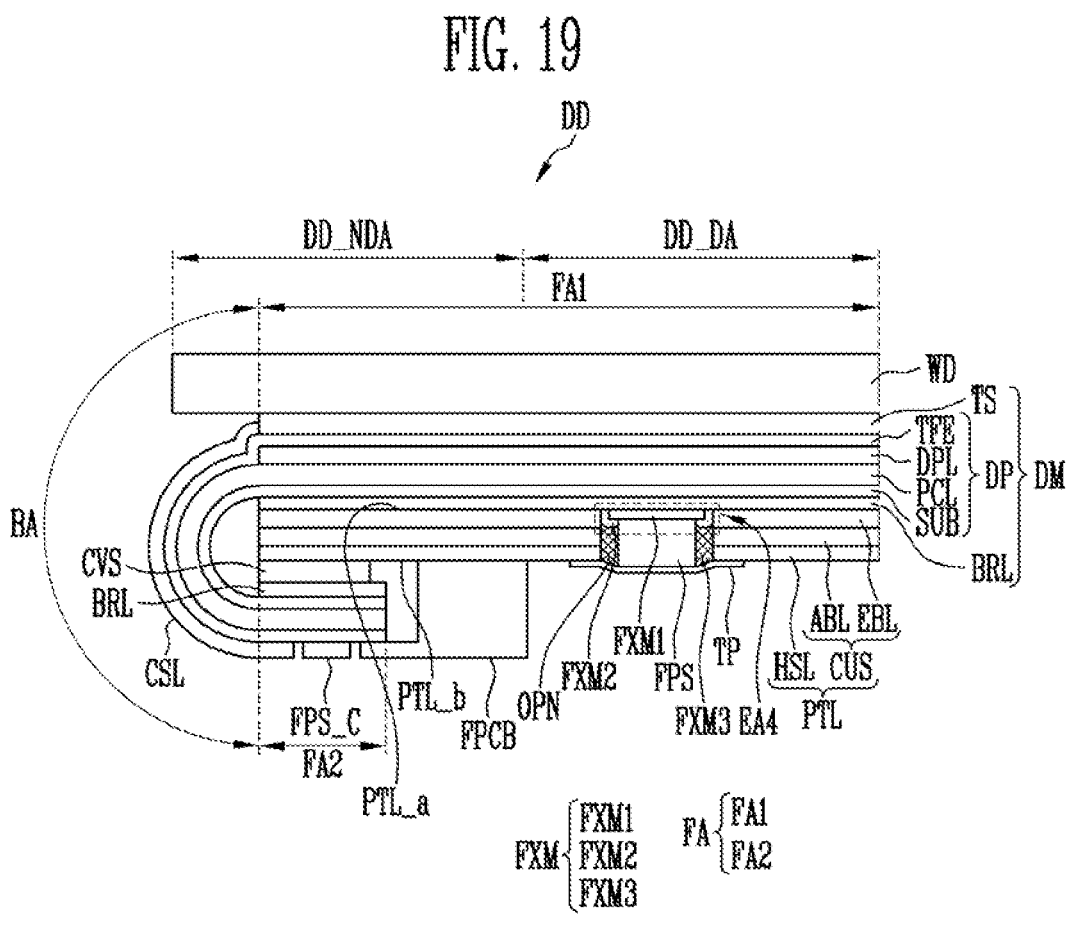
FIG. 19 is a schematic cross-sectional view illustrating a display device according to an exemplary embodiment of the present disclosure.
FIG. 20 is a schematic plan view illustrating portion EA4 shown in FIG. 19.

FIG. 19 is a schematic cross-sectional view illustrating a display device according to an exemplary embodiment of the present disclosure. FIG. 20 is a schematic plan view illustrating portion EA4 shown in FIG. 19.

The display device shown in FIGS. 19 and 20 may have a configuration substantially identical or similar to that of the display device shown in FIGS. 12 and 13, except that a third fixing member is provided between a fingerprint sensor and an opening of the cover panel.

Accordingly, in relation to the display device shown in FIGS. 19 and 20, portions different from those of the above-described embodiment will be mainly described to avoid redundancy. Portions not particularly described in this embodiment follow those of the above-described embodiment. In addition, same or similar reference numerals may refer to the same or similar components.

Referring to FIGS. 19 and 20, the display device DD, according to an exemplary embodiment of the present disclosure, may include a display module DM, a window WD, a cover panel PTL, and a fingerprint sensor FPS.

The cover panel PTL may include an opening OPN that exposes a back surface (or lower surface) of a protective layer BRL of the display module DM. The fingerprint sensor FPS may be inserted and/or buried into the opening OPN of the cover panel PTL. The fingerprint sensor FPS may be fixed and/or attached to the display module DM, e.g., the back surface (or lower surface) of the protective layer BRL, using a fixing member FXM.

In an exemplary embodiment of the present disclosure, the fixing member FXM may include a first fixing member FXM1, a second fixing member FXM2, and a third fixing member FXM3.

The first fixing member FXM1 may be provided and/or formed between the fingerprint sensor FPS and the back surface (or lower surface) of the protective layer BRL. The first fixing member FXM1 is applied onto an upper surface of the fingerprint sensor FPS to directly attach the fingerprint sensor FPS onto the back surface (or lower surface) of the protective layer BRL when the fingerprint sensor FPS is inserted into the opening OPN of the cover panel PTL. In an exemplary embodiment of the present disclosure, the first fixing member FXM1 may include a thermosetting resin that has adhesion by allowing a chemical reaction to be caused by heat.

The second fixing member FXM2 may be provided and/or formed on one side surface of the first fixing member FXM1, one side surface of the fingerprint sensor FPS, and one side surface of the back surface (or lower surface) of the protective layer BRL to instantaneously fixe and/or attach the fingerprint sensor FPS onto the back surface (or lower surface) of the protective layer BRL. In an exemplary embodiment of the present disclosure, the second fixing member FXM2 may be made of a material different from that of the first fixing member FXM1. In an exemplary embodiment of the present disclosure, the second fixing member FXM2 may include a photo-curable resin that is bridged and cured by light such as UV light.

The third fixing member FXM3 may be provided and/or formed to entirely fill an empty space between the opening OPN of the cover panel PTL and the side surface of the fingerprint sensor FPS, to stably fix the fingerprint sensor FPS into the opening OPN of the cover panel PTL. In an exemplary embodiment of the present disclosure, the third fixing member FXM3 may be made of a material different from that of the second fixing member FXM2, and be made of the same material as the first fixing member FXM1. In some exemplary embodiments of the present disclosure, the third fixing member FXM3 may be made of a material different from those of the first and second fixing members FXM1 and FXM2. For example, the third fixing member FXM3 may include a colored adhesive or transparent adhesive. A colored Optically Clear Resin (OCR) of a dark color or black may be selected as an example of the colored adhesive, but the present disclosure is not limited thereto. In addition, an Optically Clear Adhesive (OCA) may be selected as an example of the transparent adhesive, but the present disclosure is not limited thereto.

As described above, when the fingerprint sensor FPS is inserted into the opening OPN of the cover panel PTL, the fingerprint sensor FPS can be stably fixed and/or attached onto the back surface (or lower surface) of the protective layer BRL, using the above-described first to third fixing members FXM1, FXM2, and FXM3.

Figures 21, 22:
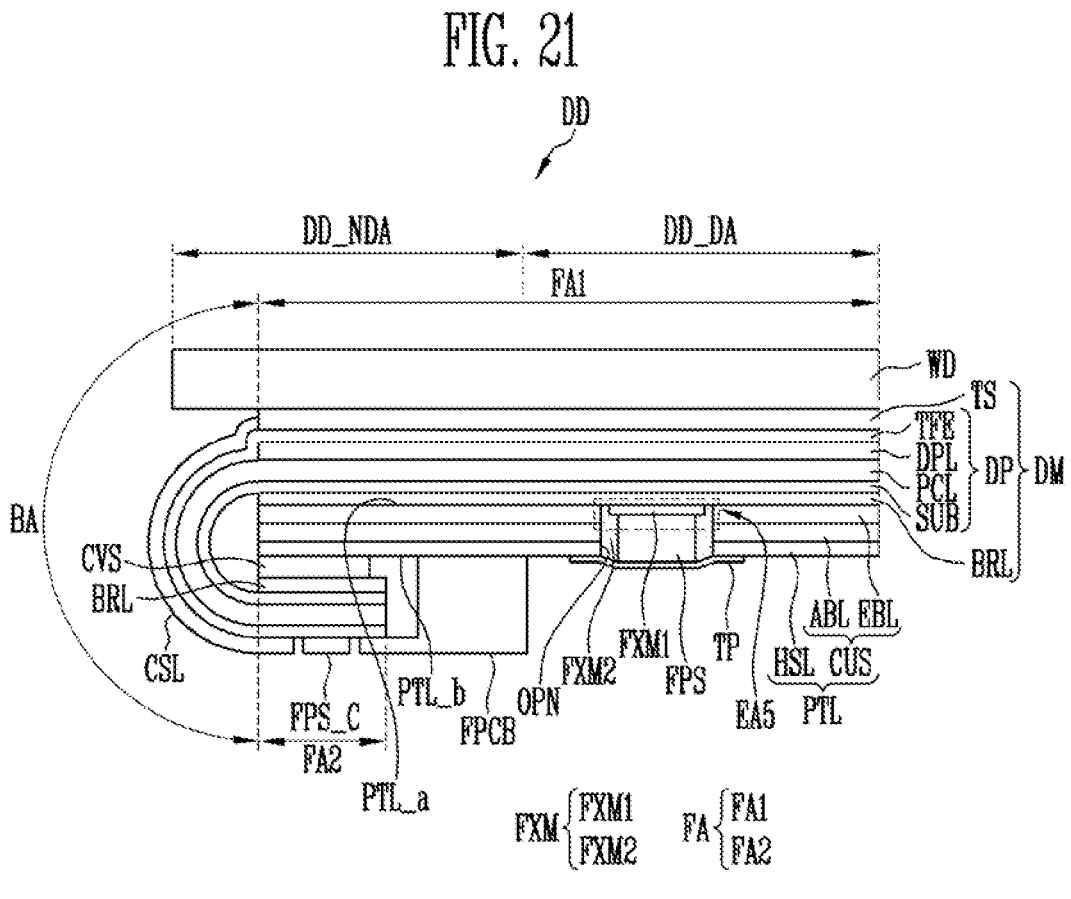
FIG. 21 is a schematic cross-sectional view illustrating a display device according to an exemplary embodiment of the present disclosure.
FIG. 22 is a schematic plan view illustrating portion EA5 shown in FIG. 21.

FIG. 21 is a schematic cross-sectional view illustrating a display device according to an exemplary embodiment of the present disclosure. FIG. 22 is a schematic plan view illustrating portion EA5 shown in FIG. 21.

The display device shown in FIGS. 21 and 22 may have a configuration substantially identical or similar to that of the display device shown in FIGS. 12 and 13, except that a second fixing member is provided to entirely fill between a fingerprint sensor and an opening of a cover panel.

Accordingly, in relation to the display device shown in FIGS. 21 and 22, portions different from those of the above-described embodiment will be mainly described to avoid redundancy. Portions not particularly described in this embodiment follow those of the above-described embodiment. In addition, the same or similar reference numerals may refer to the same or similar components.

Referring to FIGS. 21 and 22, the display device DD, according to an exemplary embodiment of the present disclosure, may include a display module DM, a window WD, a cover panel PTL, and a fingerprint sensor FPS.

The cover panel PTL may include an opening OPN that exposes a back surface (or lower surface) of a protective layer BRL of the display module DM. The fingerprint sensor FPS may be inserted into the opening OPN of the cover panel PTL. The fingerprint sensor FPS may be fixed and/or attached to the display module DM, e.g., the back surface (or lower surface) of the protective layer BRL, using a fixing member FXM.

In an exemplary embodiment of the present disclosure, the fixing member FXM may include a first fixing member FXM1 and a second fixing member FXM2, which include different materials.

The first fixing member FXM1 may be provided and/or formed between the fingerprint sensor FPS and the back surface (or lower surface) of the protective layer BRL. The first fixing member FXM1 is applied onto an upper surface of the fingerprint sensor FPS to directly attach the fingerprint sensor FPS onto the back surface (or lower surface) of the protective layer BRL when the fingerprint sensor FPS is inserted into the opening OPN of the cover panel PTL. In an exemplary embodiment of the present disclosure, the first fixing member FXM1 may include a thermosetting resin.

The second fixing member FXM2 may be provided and/or formed on one side surface of the first fixing member FXM1, one side surface of the fingerprint sensor FPS, and one side surface of the back surface (or lower surface) of the protective layer BRL to instantaneously fixe and/or attach the fingerprint sensor FPS onto the back surface (or lower surface) of the protective layer BRL. In an exemplary embodiment of the present disclosure, the second fixing member FXM2 may be made of a material different from that of the first fixing member FXM1. In an exemplary embodiment of the present disclosure, the second fixing member FXM2 may include a photo-curable resin. Also, the second fixing member FXM2 may be provided to entirely fill an empty space between the opening OPN of the cover panel PTL and the side surface of the fingerprint sensor FPS.

For example, when the fingerprint sensor FPS is inserted into the opening OPN of the cover panel PTL, an empty space may exist between the opening OPN of the cover panel PTL and the side surface of the fingerprint sensor FPS due to an attachment tolerance, etc. of the first fixing member FXM1 applied onto the upper surface of the fingerprint sensor FPS. The empty space may be viewed by a user in a display area DD_DA that displays an image. Therefore, in order to prevent the empty space from being viewed by the user, the second fixing member FXM2 may be provided and/or applied to entirely fill the empty space between the side surface of the fingerprint sensor FPS and the opening OPN of the cover panel PTL.

As described above, when the fingerprint sensor FPS is inserted into the opening OPN of the cover panel PTL, the fingerprint sensor FPS can be stably fixed and/or attached onto the back surface (or lower surface) of the protective layer BRL, using the above-described first and second fixing members FXM1 and FXM2.

Figure 23:
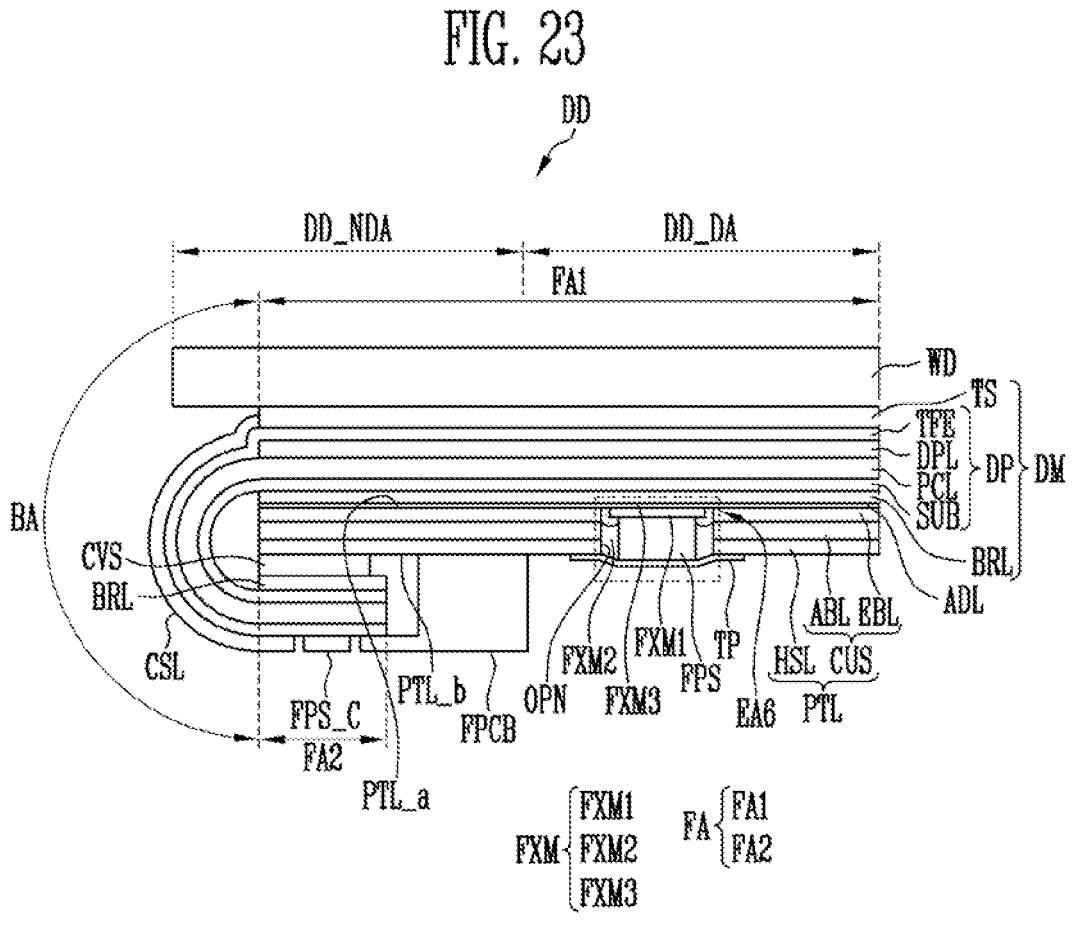
FIG. 23 is a schematic cross-sectional view illustrating a display device according to an exemplary embodiment of the present disclosure.
Figure 24:
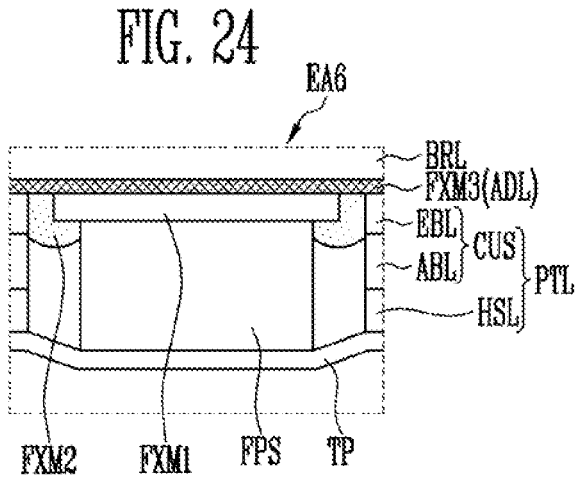
FIG. 24 is a schematic plan view illustrating portion EA6 shown in FIG. 23.

FIG. 23 is a schematic cross-sectional view illustrating a display device according to an exemplary embodiment of the present disclosure. FIG. 24 is a schematic plan view illustrating portion EA6 shown in FIG. 23.

The display device shown in FIGS. 23 and 24 may have a configuration substantially identical or similar to that of the display device shown in FIGS. 12 and 13, except that an adhesive layer is provided between a protective layer and a cover panel.

Accordingly, in relation to the display device shown in FIGS. 23 and 24, portions different from those of the above-described embodiment will be mainly described to avoid redundancy. Portions not particularly described in this embodiment follow those of the above-described embodiment. In addition, same or similar reference numerals may refer to the sane or components.

Referring to FIGS. 23 and 24, the display device DD, according to an exemplary embodiment of the present disclosure, may include a display module DM, a window WD, a cover panel PTL, and a fingerprint sensor FPS.

The cover panel PTL may include an opening OPN that exposes a back surface (or lower surface) of a protective layer BRL of the display module DM. An adhesive layer ADL (or gluing layer) may be included between the cover panel PTL and the protective layer BRL. Thus, the cover panel PTL and the protective layer BRL can be more firmly coupled (or attached) to each other by the adhesive layer ADL (or gluing layer). For example, the adhesive layer ADL (or gluing layer) may include, for example, an optically transparent adhesive such as an Optically Clear Adhesive (OCA).

The fingerprint sensor FPS may be inserted into the opening OPN of the cover panel PTL. The fingerprint sensor FPS may be fixed and/or attached to the display module DM, e.g., the back surface (or lower surface) of the protective layer BRL, using a fixing member FXM.

In an exemplary embodiment of the present disclosure, the fixing member FXM may include a first fixing member FXM1, a second fixing member FXM2, and a third fixing member FXM3.

The first fixing member FXM1 may be provided and/or formed between the fingerprint sensor FPS and the back surface (or lower surface) of the protective layer BRL. The first fixing member FXM1 is applied onto an upper surface of the fingerprint sensor FPS to directly attach the fingerprint sensor FPS onto the back surface (or lower surface) of the protective layer BRL when the fingerprint sensor FPS is inserted into the opening OPN of the cover panel PTL. In an exemplary embodiment of the present disclosure, the first fixing member FXM1 may include a thermosetting resin.

The second fixing member FXM2 may be provided and/or formed on one side surface of the first fixing member FXM1, one side surface of the fingerprint sensor FPS, and one side surface of the back surface (or lower surface) of the protective layer BRL to instantaneously fixe and/or attach the fingerprint sensor FPS onto the back surface (or lower surface) of the protective layer BRL. In an exemplary embodiment of the present disclosure, the second fixing member FXM2 may be made of a material different from that of the first fixing member FXM1. In an exemplary embodiment of the present disclosure, the second fixing member FXM2 may include a photo-curable resin.

The third fixing member FXM3 may be formed and/or provided between the back surface (or lower surface) of the protective layer BRL and the first fixing member FXM1 in the opening OPN of the cover panel PTL. In an exemplary embodiment of the present disclosure, the third fixing member FXM3 may be the adhesive ADL (or gluing layer) that couples (or attaches) the protective layer BRL and the cover panel PTL to each other. For example, the third fixing member FXM3 may be integrally provided with the adhesive ADL (or gluing layer), to be regarded as a portion of the adhesive ADL (or gluing layer). Accordingly, the third fixing member FXM3 may include a transparent adhesive, and include a material different from that of each of the first and second fixing members FXM1 and FXM2.

The third fixing member FXM3 may be exposed to the outside by the opening OPN of the cover panel PTL when the cover panel PTL and the protective layer BRL are coupled (or attached) to each other. When the fingerprint sensor FPS is inserted into the opening OPN of the cover panel PTL, the first fixing member FXM1 applied onto the upper surface of the fingerprint sensor FPS may be attached (or coupled) to the third fixing member FXM3 exposed to the outside. Accordingly, the first fixing member FXM1 can be more stably attached to the back surface (or lower surface) of the protective layer BRL by the third fixing member FXM3.

As described above, when the fingerprint sensor FPS is inserted into the opening OPN of the cover panel PTL, the fingerprint sensor FPS can be stably fixed and/or attached onto the back surface (or lower surface) of the protective layer BRL, using the above-described first to third fixing members FXM1, FXM2, and FXM3.

According to the present disclosure, there can be provided a display device capable of minimizing movement of a fingerprint sensor and increasing the sensitivity of the fingerprint sensor, using first and second fixing members made of different materials.

Exemplary embodiments of the present disclosure have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure.

What is claimed is:

1. A display device, comprising:
 a protective layer having an upper surface and a back surface opposite thereto;
 a display panel disposed on the upper surface of the protective layer, the display panel including a display area configured to display an image and a non-display area at least partially surrounding the display area;
 a cover panel disposed on the back surface of the protective layer, the cover panel including an opening that exposes at least one area of the protective layer;
 a fingerprint sensor disposed in the opening of the cover panel, the fingerprint sensor being configured to sense a fingerprint;
 a first fixing member disposed on one surface of the fingerprint sensor;
 a first-second fixing member disposed in the opening of the cover panel and at least partially overlapping with a first corner of the fingerprint sensor, the first-second fixing member fixing the fingerprint sensor to the protective layer; and
 a second-second fixing member disposed in the opening of the cover panel and at least partially overlapping with a second corner of the fingerprint sensor, the second-second fixing member fixing the fingerprint sensor to the protective layer,
 wherein the first fixing member and the first-second fixing member include at least one different material from each other, and
 wherein the first fixing member includes a thermosetting resin, and the first-second fixing member includes a photo-curable resin.

2. The display device of claim 1, wherein the second-second fixing member includes a same material as the first-second fixing member.

3. The display device of claim 1, wherein the first fixing member is disposed between the protective layer and the fingerprint sensor.

4. The display device of claim 1, wherein the first-second fixing member is disposed between the protective layer and the fingerprint sensor.

5. The display device of claim 1, wherein the first fixing member contacts the protective layer and the fingerprint sensor.

6. The display device of claim 1, wherein the first-second fixing member contacts the protective layer and the first corner of the fingerprint sensor.

7. The display device of claim 1, wherein the second-second fixing member contacts the protective layer and the second corner of the fingerprint sensor.

8. The display device of claim 1, wherein the first-second fixing member and the second-second fixing member have a dot shape.

9. The display device of claim 1, wherein the first fixing member partially overlaps at least one side of the fingerprint sensor.

10. The display device of claim 1, wherein the first-second fixing member and the second-second fixing member are spaced apart in a plan view.

11. The display device of claim 1, further comprising:

a third-second fixing member disposed in the opening of the cover panel and at least partially overlapping with a third corner of the fingerprint sensor, the third-second fixing member fixing the fingerprint sensor to the protective layer; and a fourth-second fixing member disposed in the opening of the cover panel and at least partially overlapping with a fourth corner of the fingerprint sensor, the fourth-second fixing member fixing the fingerprint sensor to the protective layer.

* * * * *